(12) United States Patent
Hemmi et al.

(10) Patent No.: US 9,598,784 B2
(45) Date of Patent: Mar. 21, 2017

(54) ELECTROFORMED COMPONENT PRODUCTION METHOD

(71) Applicant: OMRON Corporation, Kyoto-shi, Kyoto (JP)

(72) Inventors: Yoshinobu Hemmi, Shiga (JP); Takahiro Sakai, Shiga (JP); Hideaki Ozaki, Osaka (JP); Hirotada Teranishi, Osaka (JP)

(73) Assignee: OMRON Corporation, Kyoto (JP)

( * ) Notice: Subject to any disclaimer, the term of this patent is extended or adjusted under 35 U.S.C. 154(b) by 35 days.

(21) Appl. No.: 14/787,453

(22) PCT Filed: Jul. 22, 2014

(86) PCT No.: PCT/JP2014/069339
§ 371 (c)(1),
(2) Date: Oct. 27, 2015

(87) PCT Pub. No.: WO2015/016099
PCT Pub. Date: Feb. 5, 2015

(65) Prior Publication Data
US 2016/0115610 A1    Apr. 28, 2016

(30) Foreign Application Priority Data
Aug. 2, 2013  (JP) ................. 2013-161824

(51) Int. Cl.
*C25D 1/00*    (2006.01)
*C25D 1/10*    (2006.01)
(Continued)

(52) U.S. Cl.
CPC .............. *C25D 1/003* (2013.01); *C25D 1/00* (2013.01); *C25D 1/10* (2013.01); *C25D 1/20* (2013.01); *G01R 1/06722* (2013.01); *G01R 3/00* (2013.01)

(58) Field of Classification Search
CPC . C25D 1/003; C25D 1/10; C25D 1/20; C25D 1/00
See application file for complete search history.

(56) References Cited

U.S. PATENT DOCUMENTS 4,356,223 A * 10/1982 Iida ................. G03F 9/7076
257/E23.179
6,030,515 A    2/2000 Heyers et al.
(Continued)

FOREIGN PATENT DOCUMENTS

JP    H07-115110 A    5/1995
JP    H07-288269 A    10/1995
(Continued)

OTHER PUBLICATIONS

Notification of Transmittal of Translation of the International Preliminary Report on Patentability for corresponding International Application No. # PCT/JP2014/069339, mailed Feb. 11, 2016 (1 page).
(Continued)

*Primary Examiner* — Stefanie S Wittenberg
(74) *Attorney, Agent, or Firm* — Osha Liang LLP

(57) ABSTRACT

A contact element (25) (electroformed product) is produced by electroforming. The contact element (25) has a surface on which an insulating film (28) having been formed by use of a dry film resist or the like is provided. In a process of producing the contact element (25), the insulating film (28) is provided after a step of producing the contact element 25. This makes it possible to provide electroformed components configured so that respective electroformed products (contact terminals) are arranged at narrow pitches while maintaining electrical insulation of the electroformed products from each other.

11 Claims, 26 Drawing Sheets

(51) Int. Cl.
*C25D 1/20* (2006.01)
*G01R 1/067* (2006.01)
*G01R 3/00* (2006.01)

(56) References Cited

U.S. PATENT DOCUMENTS

| | | | |
|---|---|---|---|
| 6,383,720 | B1 | 5/2002 | Nakashima et al. |
| 2005/0126917 | A1 | 6/2005 | Morimoto |
| 2006/0057895 | A1 | 3/2006 | Fujita et al. |
| 2008/0032559 | A1 | 2/2008 | Fujita et al. |
| 2009/0071837 | A1 | 3/2009 | Fredenberg et al. |
| 2009/0183992 | A1 | 7/2009 | Fredenberg et al. |
| 2009/0205967 | A1 | 8/2009 | Fredenberg et al. |
| 2009/0218233 | A1 | 9/2009 | Fredenberg et al. |
| 2009/0229854 | A1 | 9/2009 | Fredenberg et al. |
| 2009/0229855 | A1 | 9/2009 | Fredenberg et al. |
| 2009/0229856 | A1 | 9/2009 | Fredenberg et al. |
| 2009/0229857 | A1 | 9/2009 | Fredenberg et al. |
| 2012/0267241 | A1 | 10/2012 | Fredenberg et al. |
| 2012/0279866 | A1 | 11/2012 | Fredenberg et al. |
| 2012/0305390 | A1 | 12/2012 | Fredenberg et al. |
| 2013/0033282 | A1 | 2/2013 | Sato et al. |
| 2013/0249585 | A1 | 9/2013 | Kinuta |
| 2014/0110265 | A1 | 4/2014 | Fredenberg et al. |
| 2014/0329418 | A1 | 11/2014 | Ishikawa et al. |

FOREIGN PATENT DOCUMENTS

| | | | |
|---|---|---|---|
| JP | H07-316872 A | 12/1995 | |
| JP | H11-100689 A | 4/1999 | |
| JP | H11-100698 A | 4/1999 | |
| JP | 2000-151078 A | 5/2000 | |
| JP | 2002-161388 A | 6/2002 | |
| JP | 2005-200765 A | 7/2005 | |
| JP | 2005-257693 A | 9/2005 | |
| JP | 2006-004788 A | 1/2006 | |
| JP | 2007-227495 A | 9/2007 | |
| JP | 2009-516080 A | 4/2009 | |
| JP | 2009-146919 A | 7/2009 | |
| JP | 2010-132959 A | 6/2010 | |
| JP | 2011-040687 A | 2/2011 | |
| JP | 2011-226786 A | 11/2011 | |
| JP | 2012-132685 A | 7/2012 | |
| JP | 5073880 B1 | 11/2012 | |
| JP | 2013-124404 A | 6/2013 | |
| KR | 2011-0033933 A | 4/2011 | |
| WO | 2004/068649 A1 | 8/2004 | |

OTHER PUBLICATIONS

International Preliminary Report on Patentability for corresponding International Application No. # PCT/JP2014/069339, mailed Feb. 2, 2016 (8 page).
International Search Report issued in PCT/JP2014/069339 mailed on Oct. 28, 2014 (3 pages).
Written Opinion of the International Searching Authority issued in PCT/JP2014/069339 mailed on Oct. 28, 2014 (5 pages).
Decision to Grant a Patent for corresponding Japanese Application No. 2013-161824 mailed on Jun. 30, 2015 (6 pages).
Notification of Reasons for Refusal for corresponding Japanese Application No. 2013-161824 mailed on Oct. 21, 2014 (9 pages).
Decision to Grant a Patent for corresponding Korean Application No. 10-2015-7030616 issued on Nov. 4, 2015 (2 pages).

* cited by examiner

FIG. 7
(A)
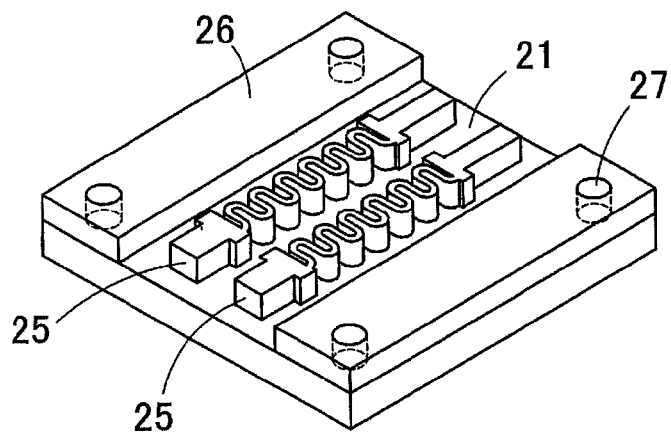
(B)
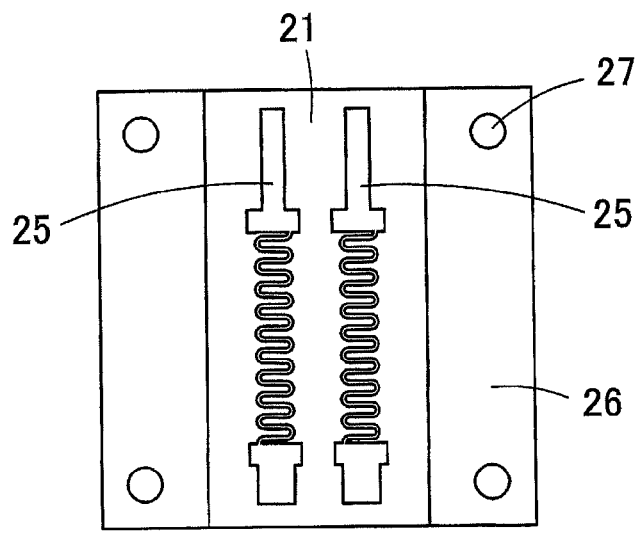
(C)
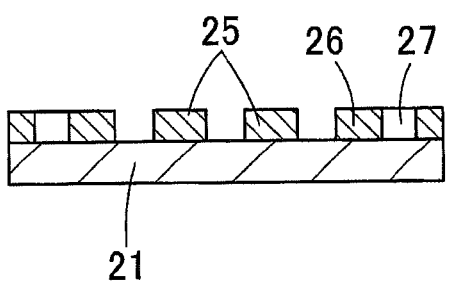

ELECTROFORMED COMPONENT PRODUCTION METHOD

TECHNICAL FIELD

The present invention relates to an electroformed component and a method of producing the electroformed component.

BACKGROUND ART

Figure 1:
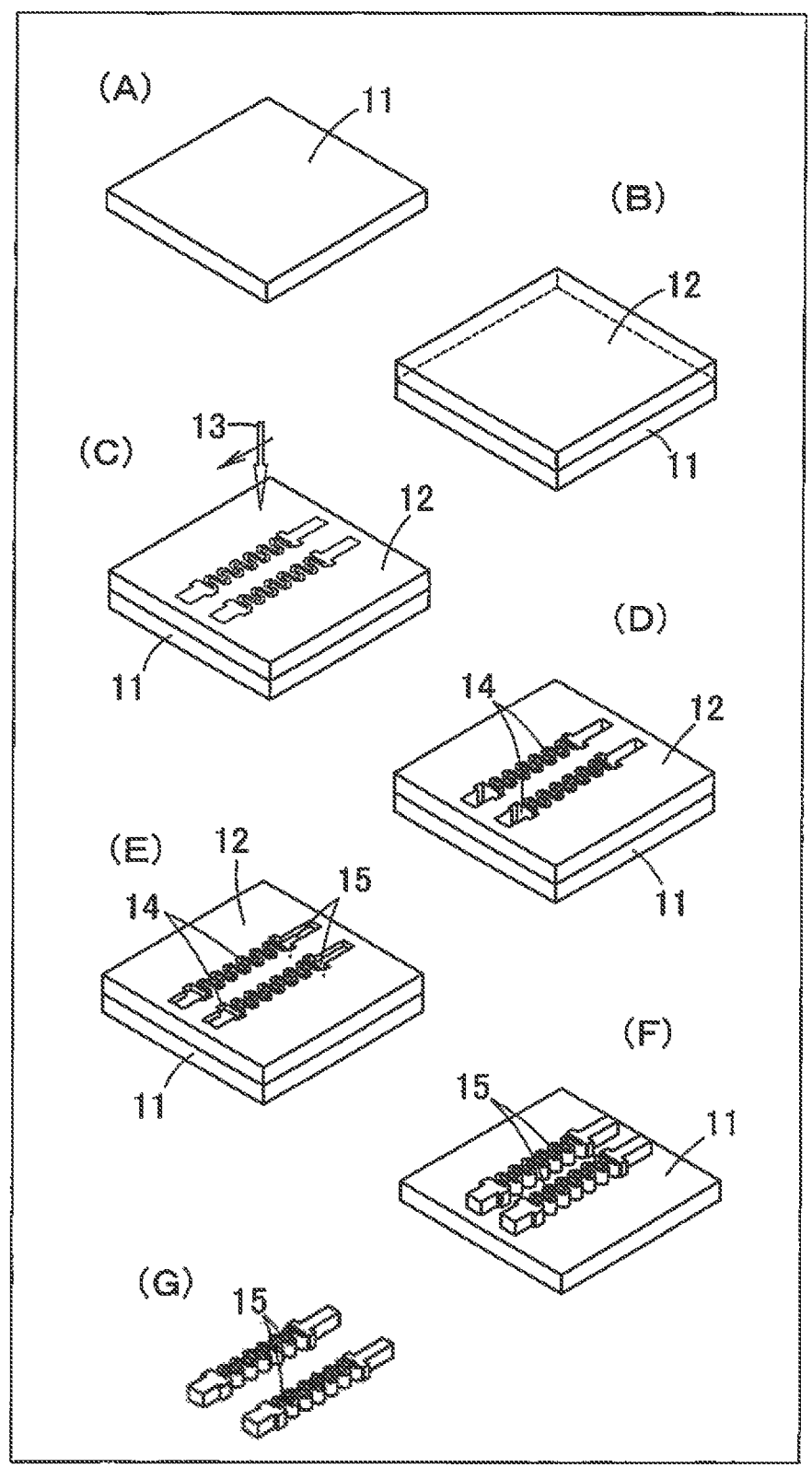

FIG. 1 is a perspective view illustrating a method of producing a conventional electroformed component, that is, a contact. First, as a pretreatment, a surface of an electrically conductive base material 11 is subjected to electrolytic degreasing as illustrated in (A) of FIG. 1. Then, as illustrated in (B) of FIG. 1, a photoresist 12 is applied to the surface of the electrically conductive base material 11. Then, as illustrated in (C) of FIG. 1, a laser beam 13 is scanned, with the use of a direct writing exposure device, along a region of the surface of the photoresist 12, except for a region having a contact shape. In a case where the photoresist 12 is a negative resist, a light-exposed part of the photoresist 12 becomes insoluble. Therefore, in a case where a part not having been exposed to the light in a developing step has been removed, openings 14 (cavities) each having a contact shape are made in the photoresist 12 (see (D) of FIG. 1). Then, in a case where a metal material is precipitated on an exposed surface of the electrically conductive base material 11 by electroforming, electroformed components (i.e. contacts 15) are obtained in the respective openings 14 (see (E) of FIG. 1). Then, the photoresist 12 is peeled from the electrically conductive base material 11 (see (F) of FIG. 1). Then, the contacts 15 are peeled from the electrically conductive base material 11 (see (G) of FIG. 1). This allows desired contacts 15 to be fabricated.

Such contacts are sometimes used in such a manner as to be arranged at narrow pitches while maintaining electrical insulation from each other. For example, as disclosed in Patent Literature 1, the contacts may be used for a probe card that carries out electrical inspection of a highly dense microcircuit board. According to the probe card disclosed in Patent Literature 1, an insulator is sandwiched between a pair of substrates, and contacts such as those described above are contained in respective through-holes made through the insulator. Each of the substrates has supporting holes so as to face the corresponding through-holes of the insulator. Both ends of each of the contacts are inserted into respective supporting holes of corresponding substrates.

According to such a probe card, an end part of each of the contacts comes into contact with a corresponding electrode (inter-electrode pitch: 30 µm to 200 µm) of the microcircuit board to be measured. Therefore, narrow pitches between the electrodes of the microcircuit board to be measured make it necessary to provide the contacts to be arranged at narrow pitches as well.

According to the structure disclosed in Patent Literature 1, however, a thickness between adjacent through-holes and a thickness between adjacent supporting holes need to be thin in order to arrange the contacts at narrow pitches. This poses a problem in terms of strength of the probe card. In addition, even if pitches between adjacent through-holes and pitches between adjacent supporting holes can be made narrow, it is still difficult to insert the contacts, each of which is thin and extremely small, into corresponding through-holes and corresponding supporting holes, and then to arrange the contacts.

CITATION LIST

Patent Literature

[Patent Literature 1]
Japanese Patent Application Publication, Tokukai, No. 2012-132685

SUMMARY OF INVENTION

Technical Problem

It is an object of the present invention to provide (i) electroformed components which allow electroformed products, such as contact elements, to be arranged at narrow pitches while maintaining electrical insulation of the electroformed products from each other and (ii) an electroformed component production method of producing each of the electroformed components.

Solution to Problem

An electroformed component production method of the present invention includes: an electrodepositing step of fabricating an electroformed product by electrodepositing a metal on an exposed surface which is at least part of an electrically conductive base material and which is exposed within an opening of an insulating mold form; a mold form removing step of removing the insulating mold form from a surface of the electrically conductive base material; an insulating film forming step of covering a surface of the electroformed product with an insulating film; and an insulating film removing step of removing part of the insulating film while causing a remaining part of the insulating film to remain on at least part of the surface of the electroformed product.

BRIEF DESCRIPTION OF DRAWINGS (A) through (G) of FIG. 1 are perspective views for describing a step of producing conventional contacts.

Figure 2:
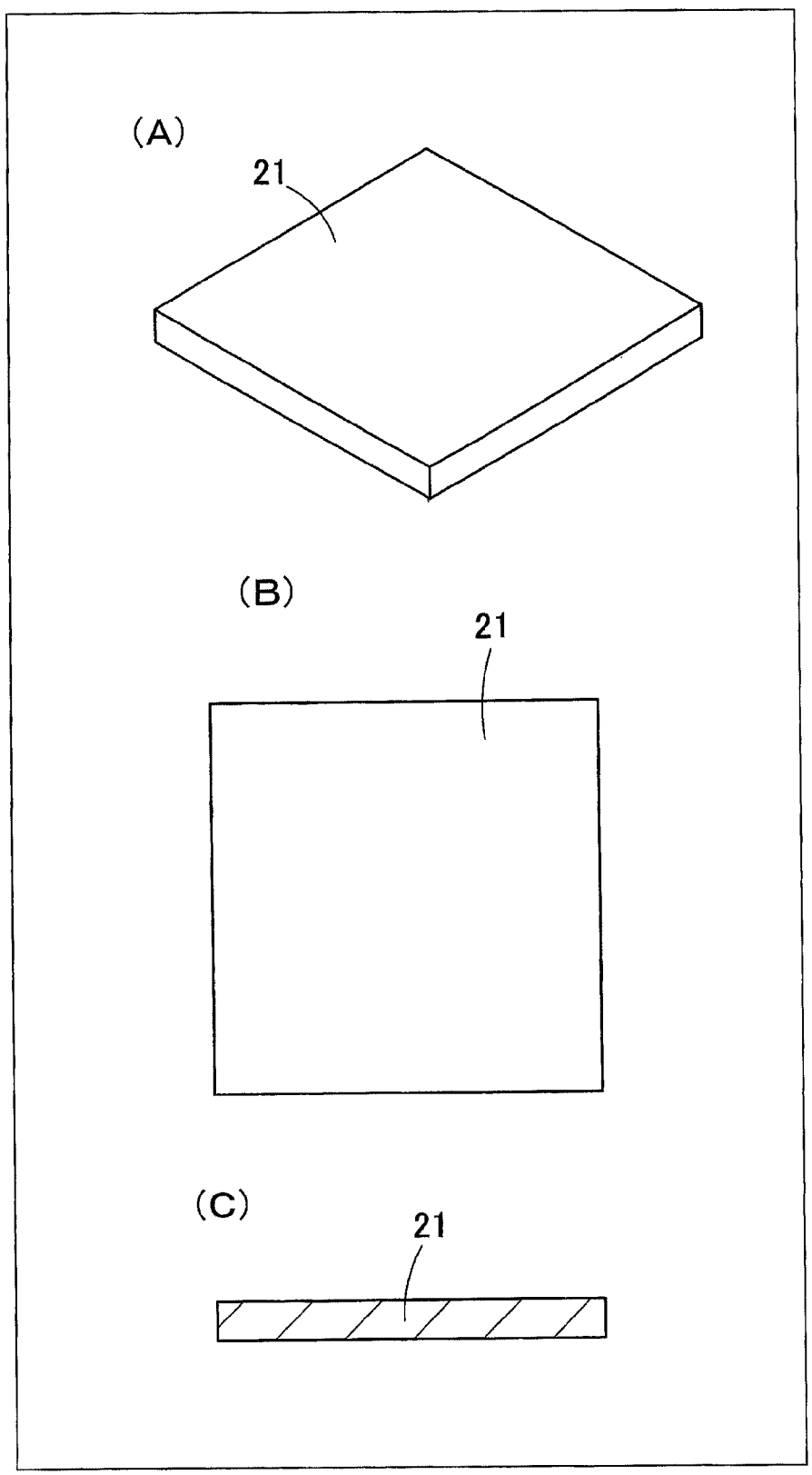

(A) through (C) of FIG. 2 are a perspective view, a plan view and a cross-sectional view, respectively, which illustrate a step of electrolytic degreasing an electrically conductive base material in accordance with Embodiment 1 of the present invention.

Figure 3:
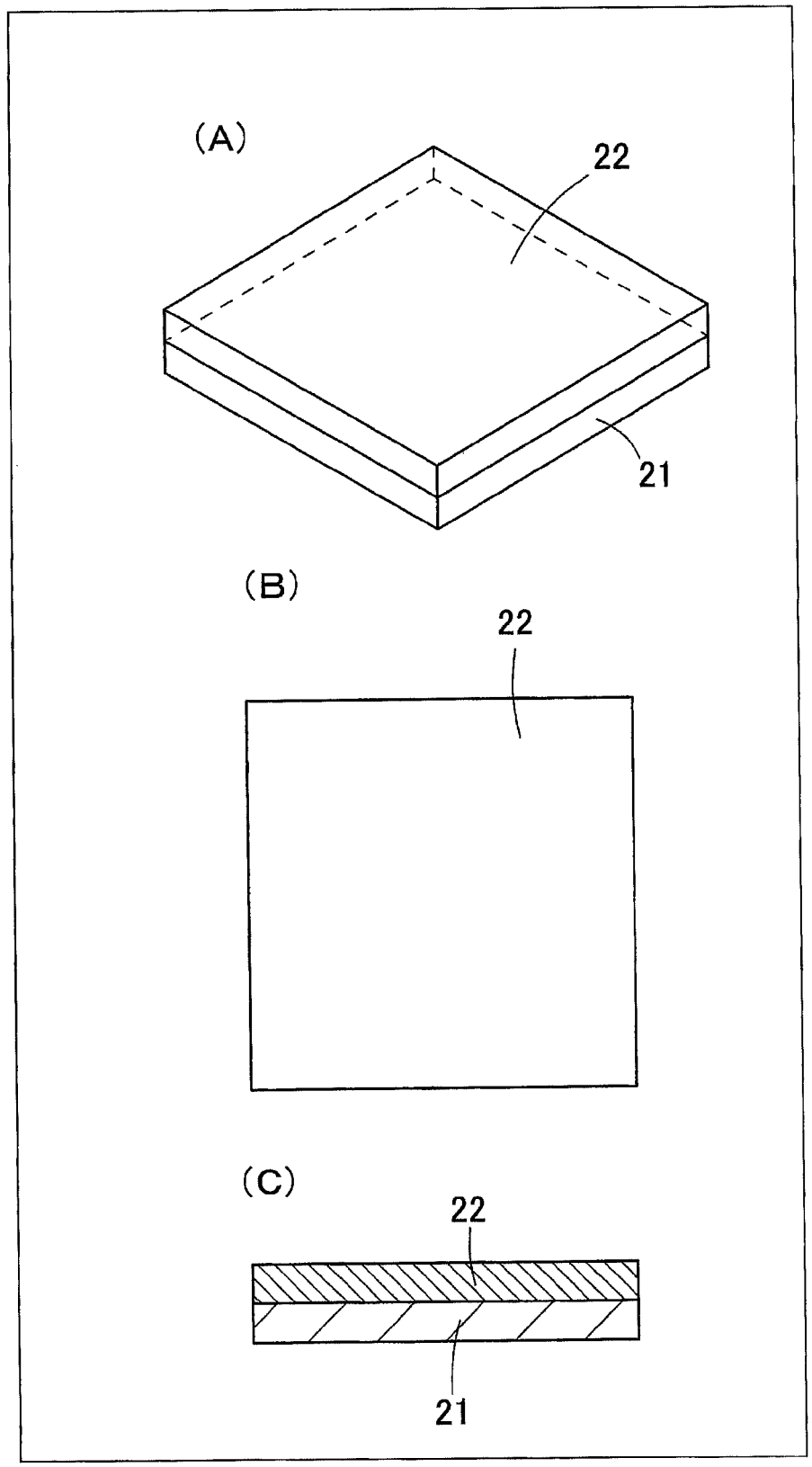

(A) through (C) of FIG. 3 are a perspective view, a plan view and a cross-sectional view, respectively, which illustrate a step of laminating a dry film resist in accordance with Embodiment 1 of the present invention.

Figure 4:
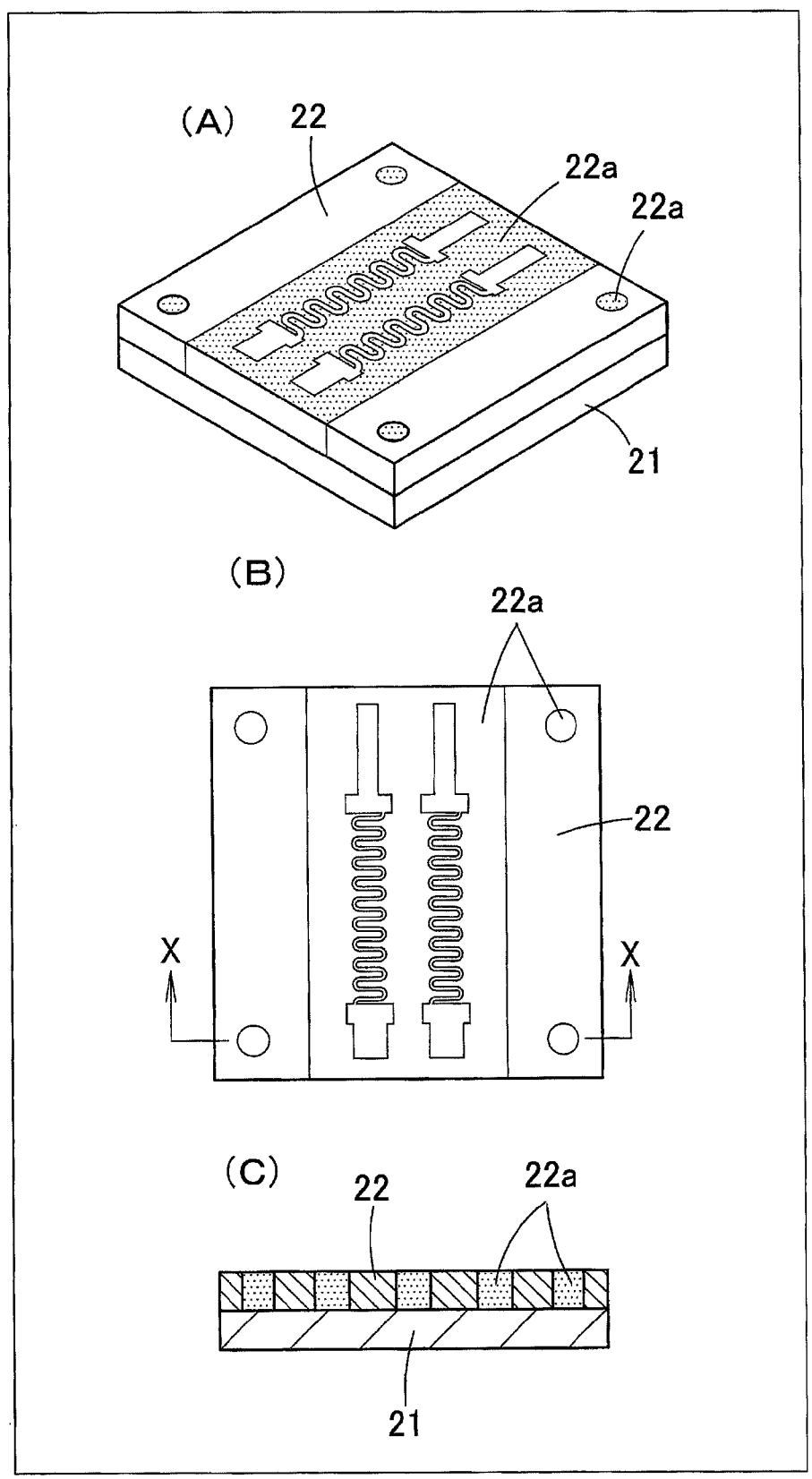

(A) and (B) of FIG. 4 are a perspective view and a plan view, respectively, which illustrate a step of exposing the dry film resist in accordance with Embodiment 1 of the present invention. (C) of FIG. 4 is a cross-sectional view taken along the line X-X shown in (B) of FIG. 4.

Figure 5:
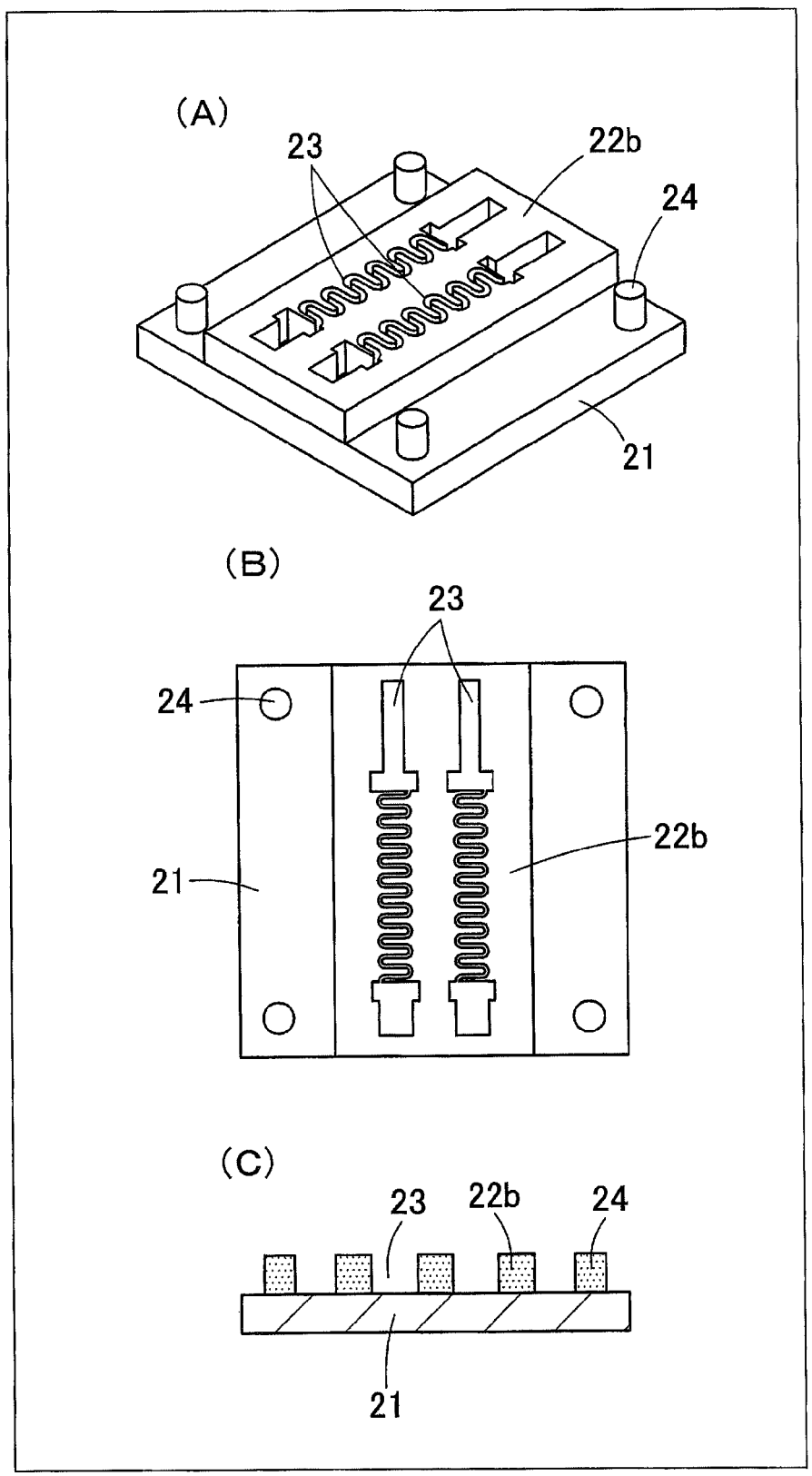

(A) through (C) of FIG. 5 are a perspective view, a plan view and a cross-sectional view, respectively, which illustrate a step of fabricating a mold form by developing the dry film resist in accordance with Embodiment 1 of the present invention.

Figure 6:
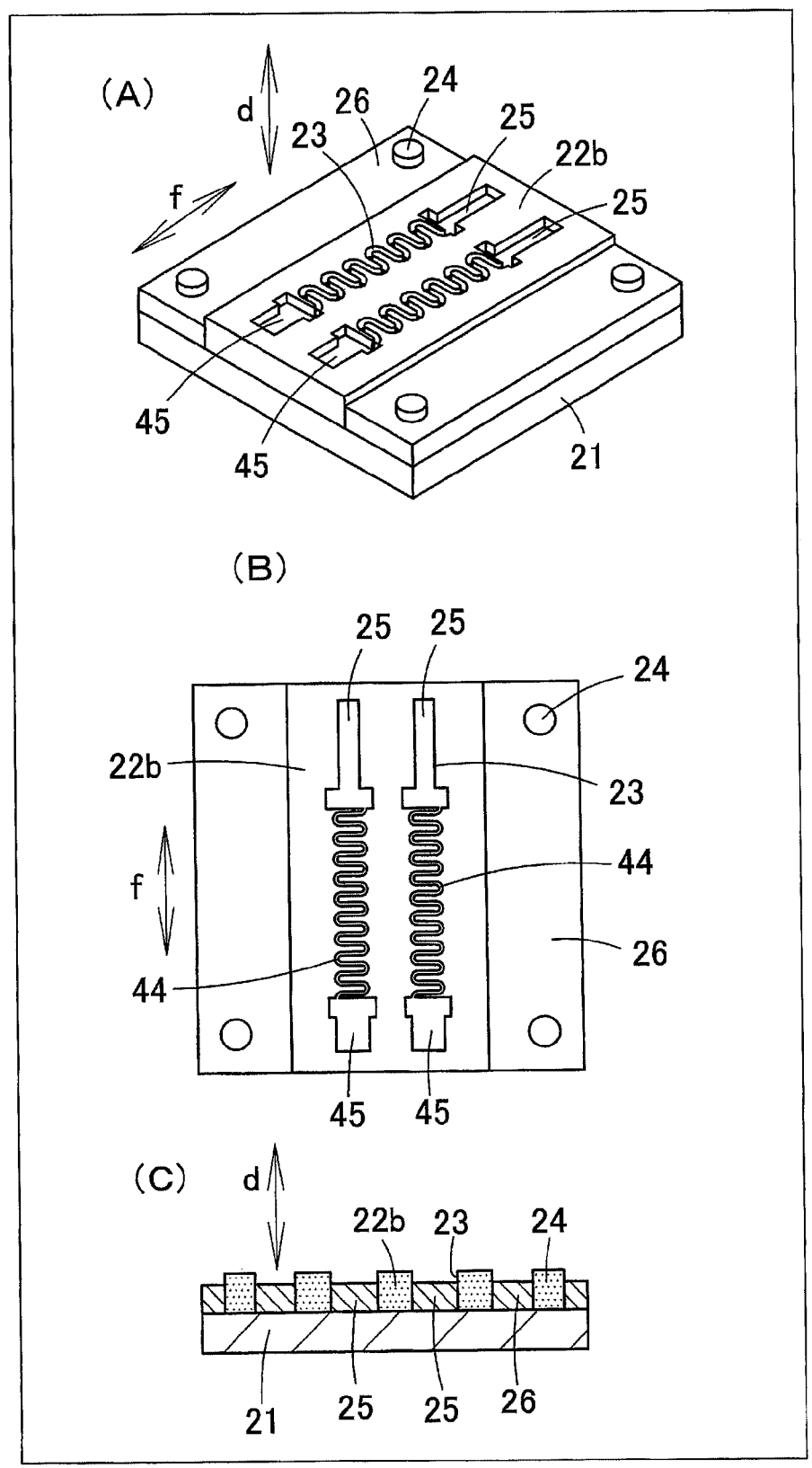

(A) through (C) of FIG. 6 are a perspective view, a plan view and a cross-sectional view, respectively, which illustrate a step of electroforming in accordance with Embodiment 1 of the present invention.

(A) through (C) of FIG. 7 are a perspective view, a plan view and a cross-sectional view, respectively, which illustrate a step of removing the mold form in accordance with Embodiment 1 of the present invention.

Figure 8:
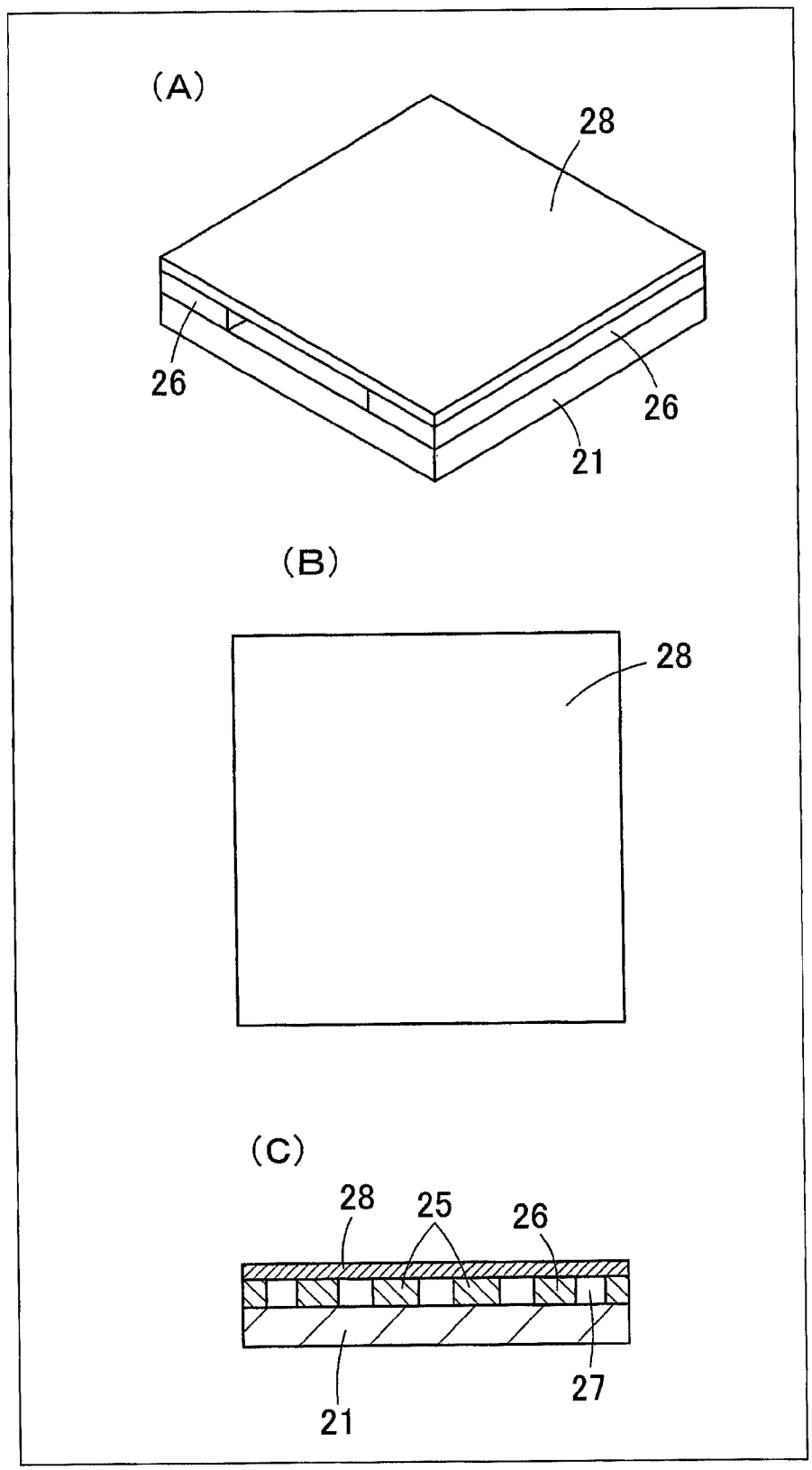

(A) through (C) of FIG. 8 are a perspective view, a plan view and a cross-sectional view, respectively, which illustrate a step of laminating an insulating film (dry film resist) in accordance with Embodiment 1 of the present invention.

Figure 9:
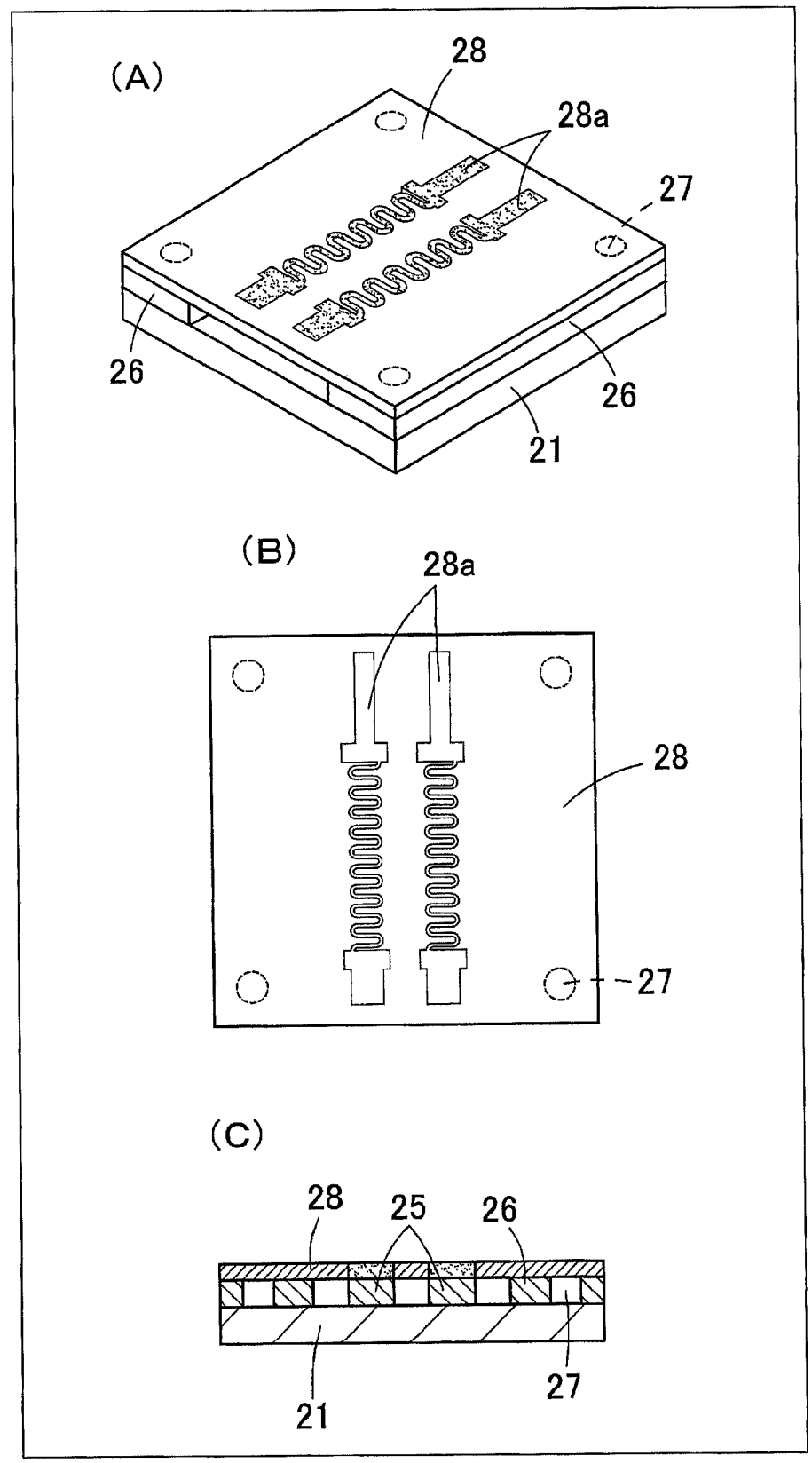

(A) through (C) of FIG. 9 are a perspective view, a plan view and a cross-sectional view, respectively, which illustrate an step of exposing the insulating film in accordance with Embodiment 1 of the present invention.

Figure 10:
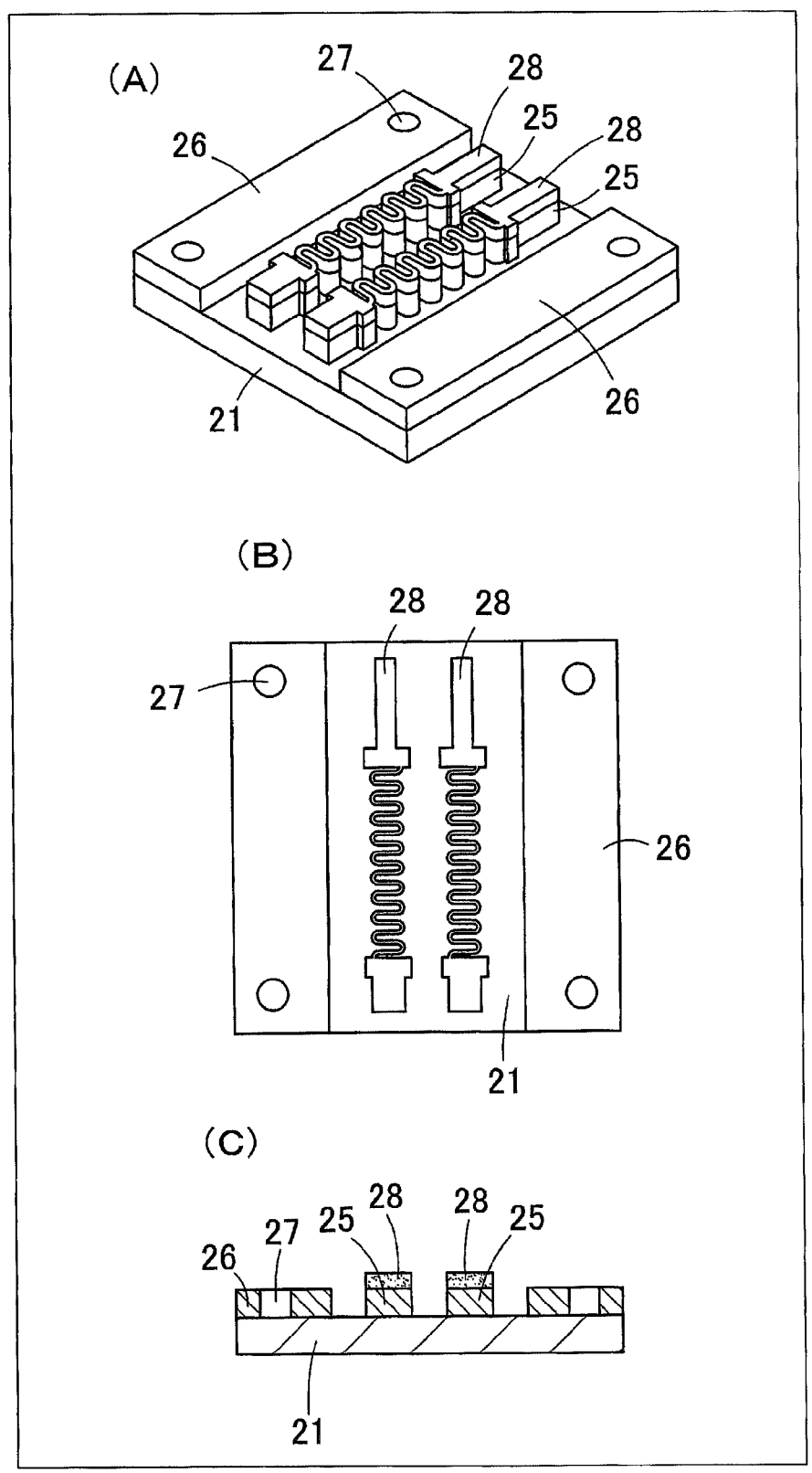

(A) through (C) of FIG. 10 are a perspective view, a plan view and a cross-sectional view, respectively, which illustrate a developing the insulating film in accordance with Embodiment 1 of the present invention.

Figure 11:
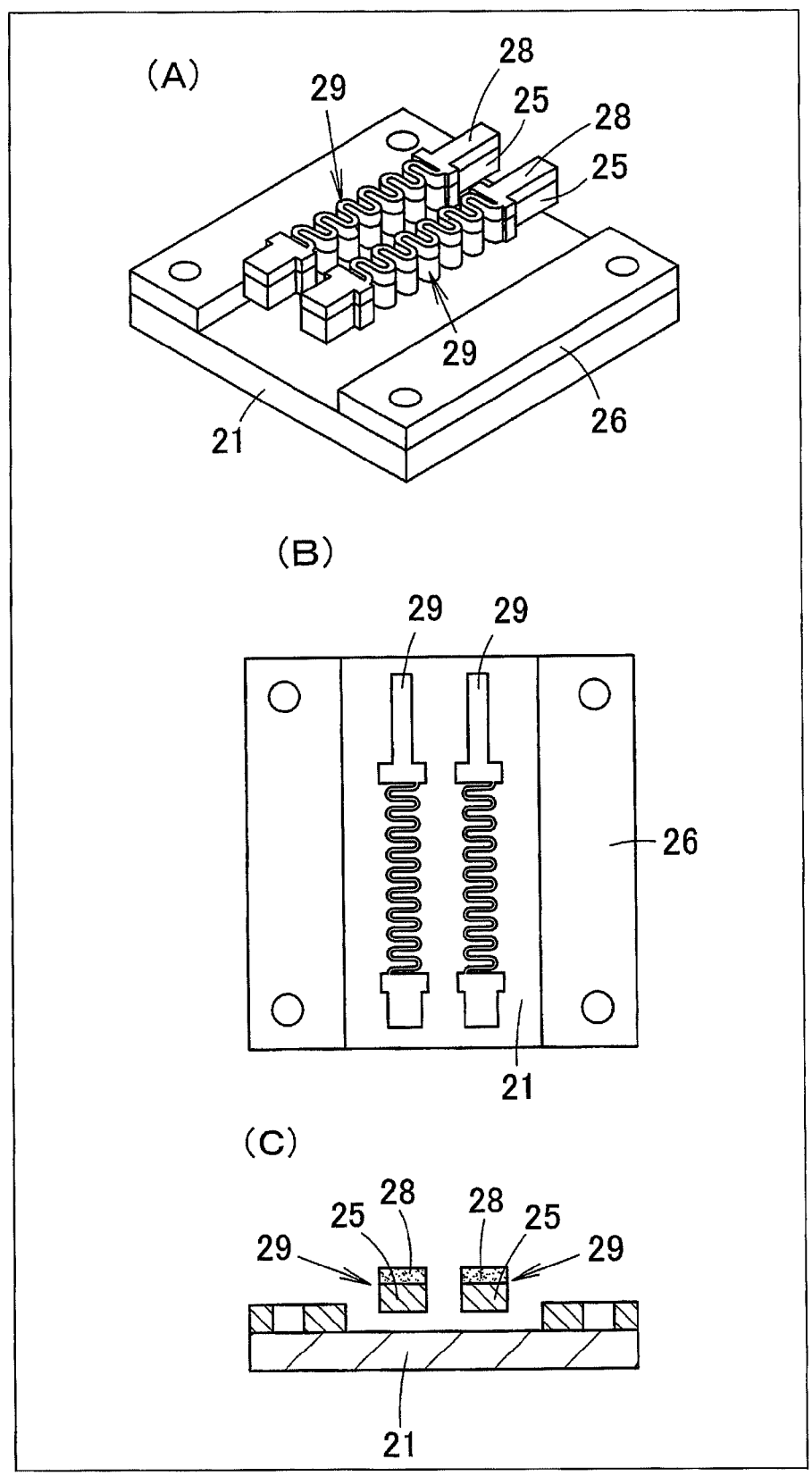

(A) through (C) of FIG. 11 are a perspective view, a plan view and a cross-sectional view, respectively, which illustrate a step of peeling electroformed components in accordance with Embodiment 1 of the present invention.

Figure 12:
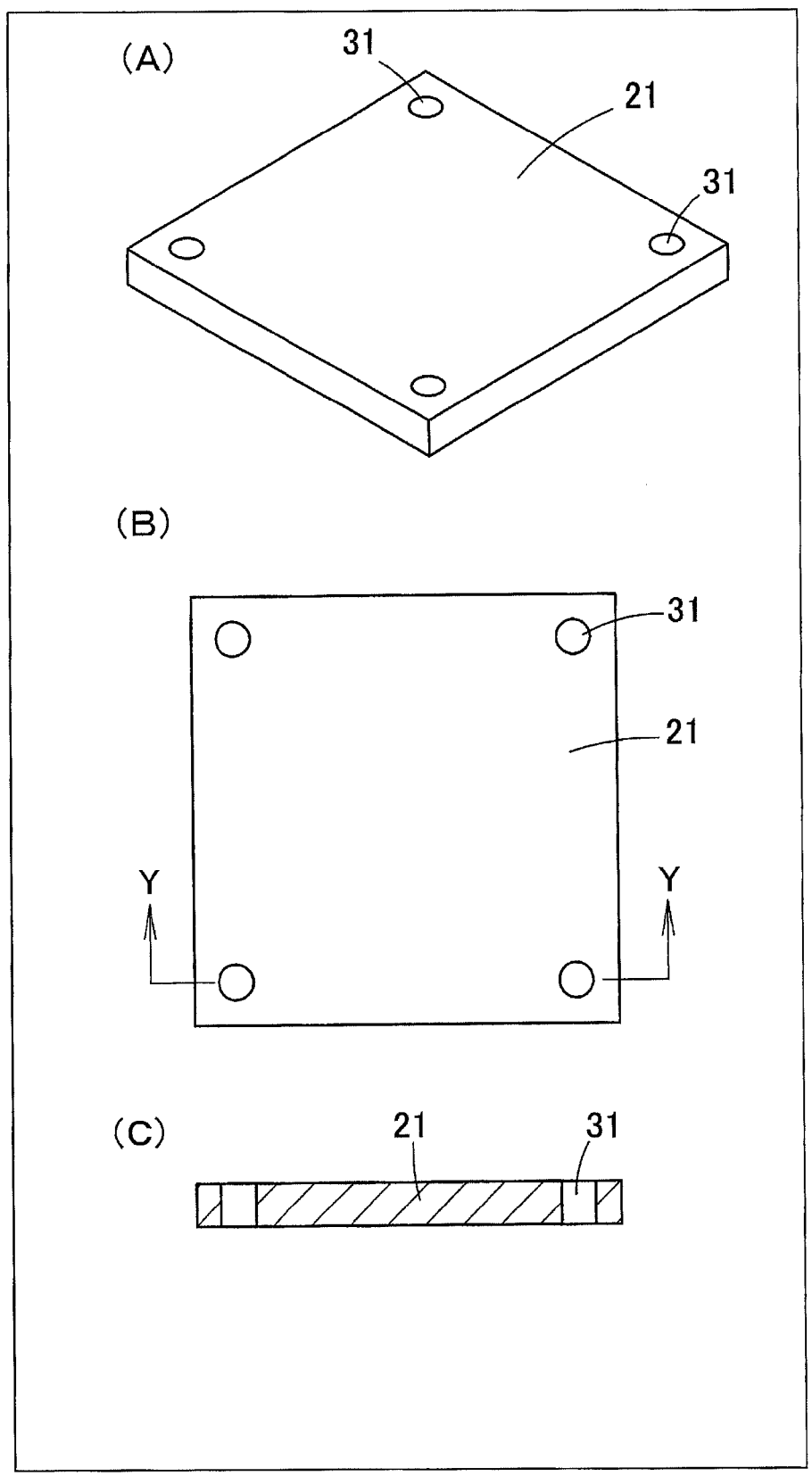

(A) and (B) of FIG. 12 are a perspective view and a plan view, respectively, which illustrate a step of making position determining holes through an electrically conductive base material in accordance with Embodiment 2 of the present invention. (C) of FIG. 12 is a cross-sectional view taken along the line Y-Y shown in (B) of FIG. 12.

Figure 13:
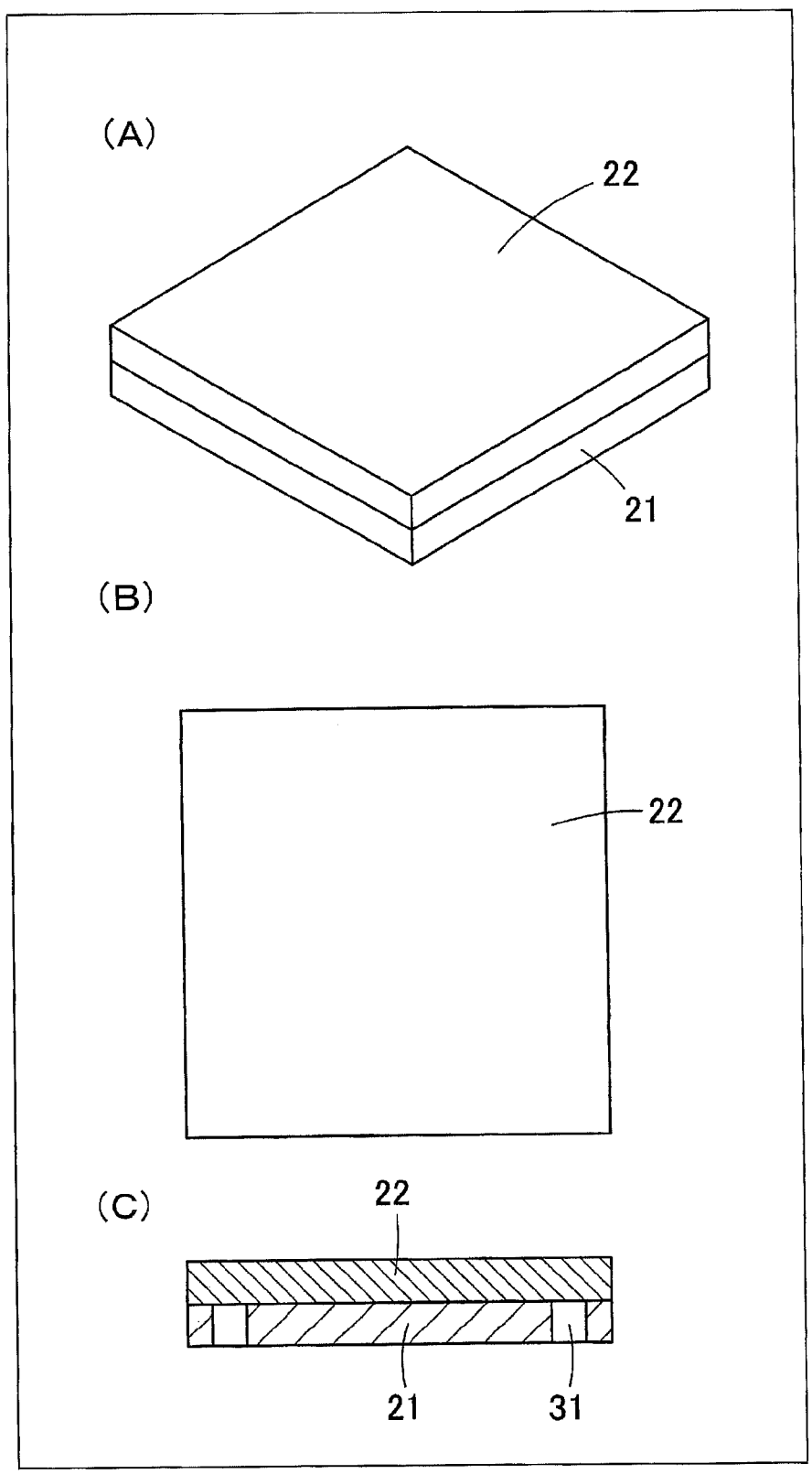

(A) through (C) of FIG. 13 are a perspective view, a plan view and a cross-sectional view, respectively, which illustrate a step of laminating a dry film resist in accordance with Embodiment 2 of the present invention.

Figure 14:
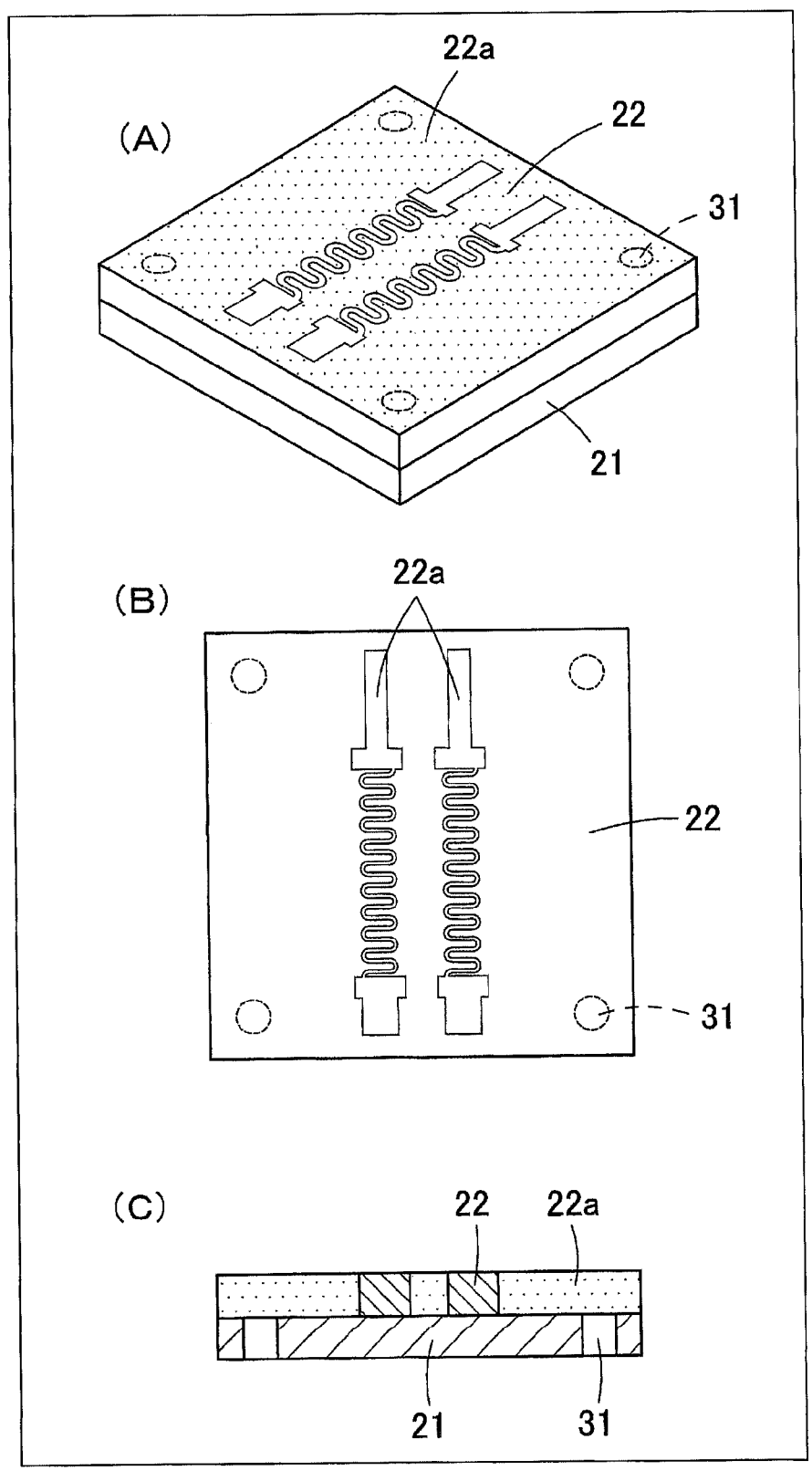

(A) through (C) of FIG. 14 are a perspective view, a plan view and a cross-sectional view, respectively, which illustrate a step of exposing the dry film resist in accordance with Embodiment 2 of the present invention.

Figure 15:
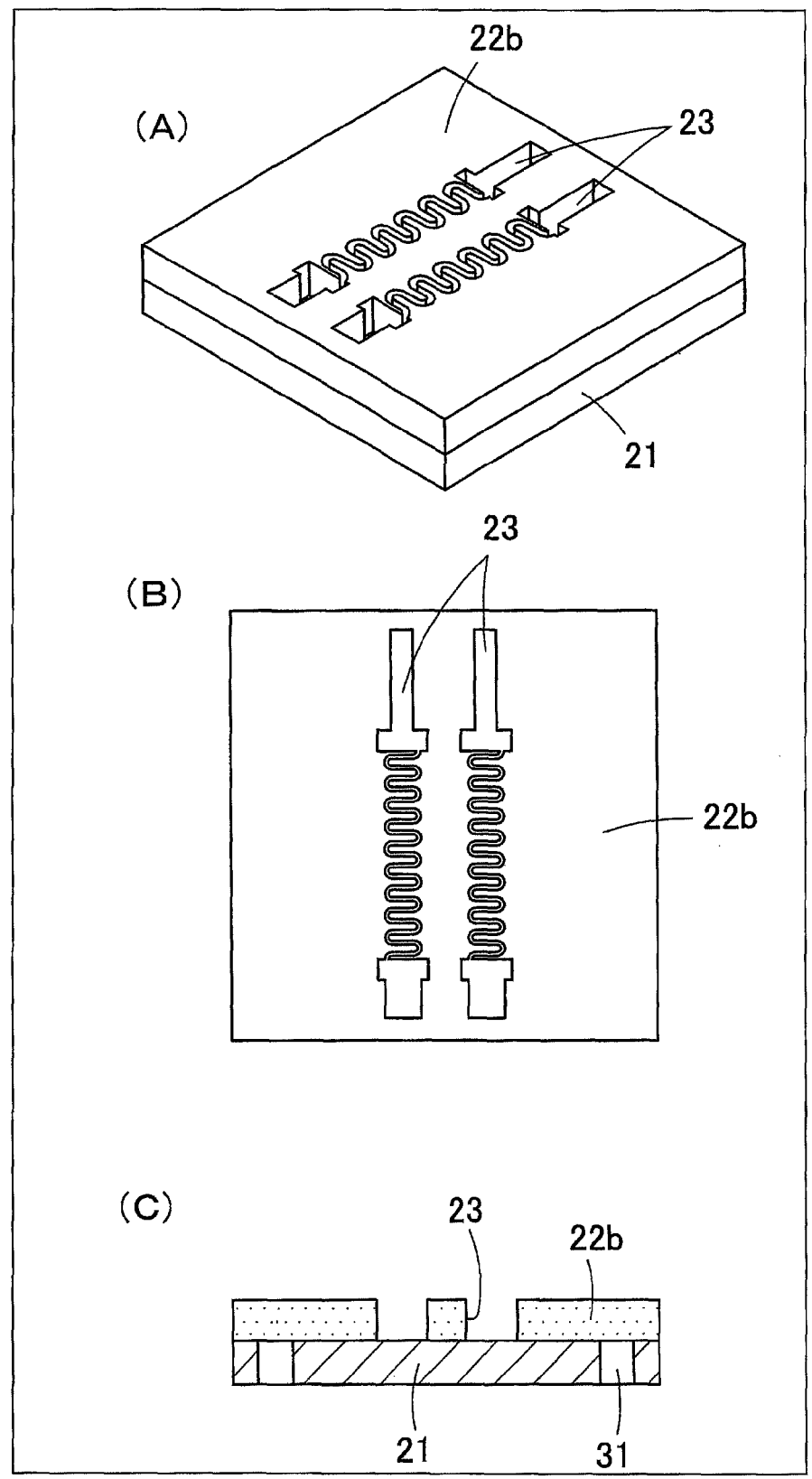

(A) through (C) of FIG. 15 are a perspective view, a plan view and a cross-sectional view, respectively, which illustrate a step of fabricating a mold form by developing the dry film resist in accordance with Embodiment 2 of the present invention.

Figure 16:
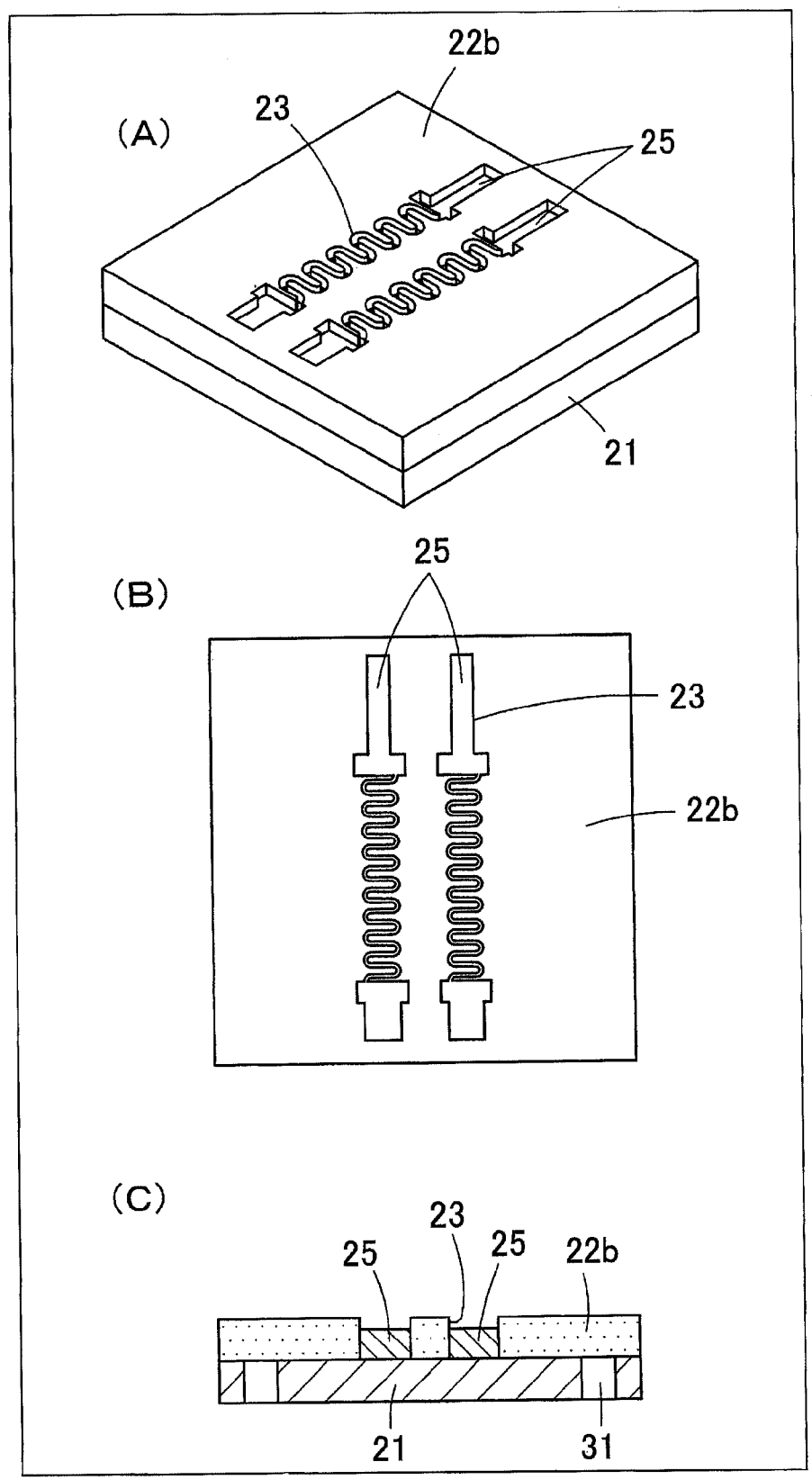

(A) through (C) of FIG. 16 are a perspective view, a plan view and a cross-sectional view, respectively, which illustrate a step of electroforming in accordance with Embodiment 2 of the present invention.

Figure 17:
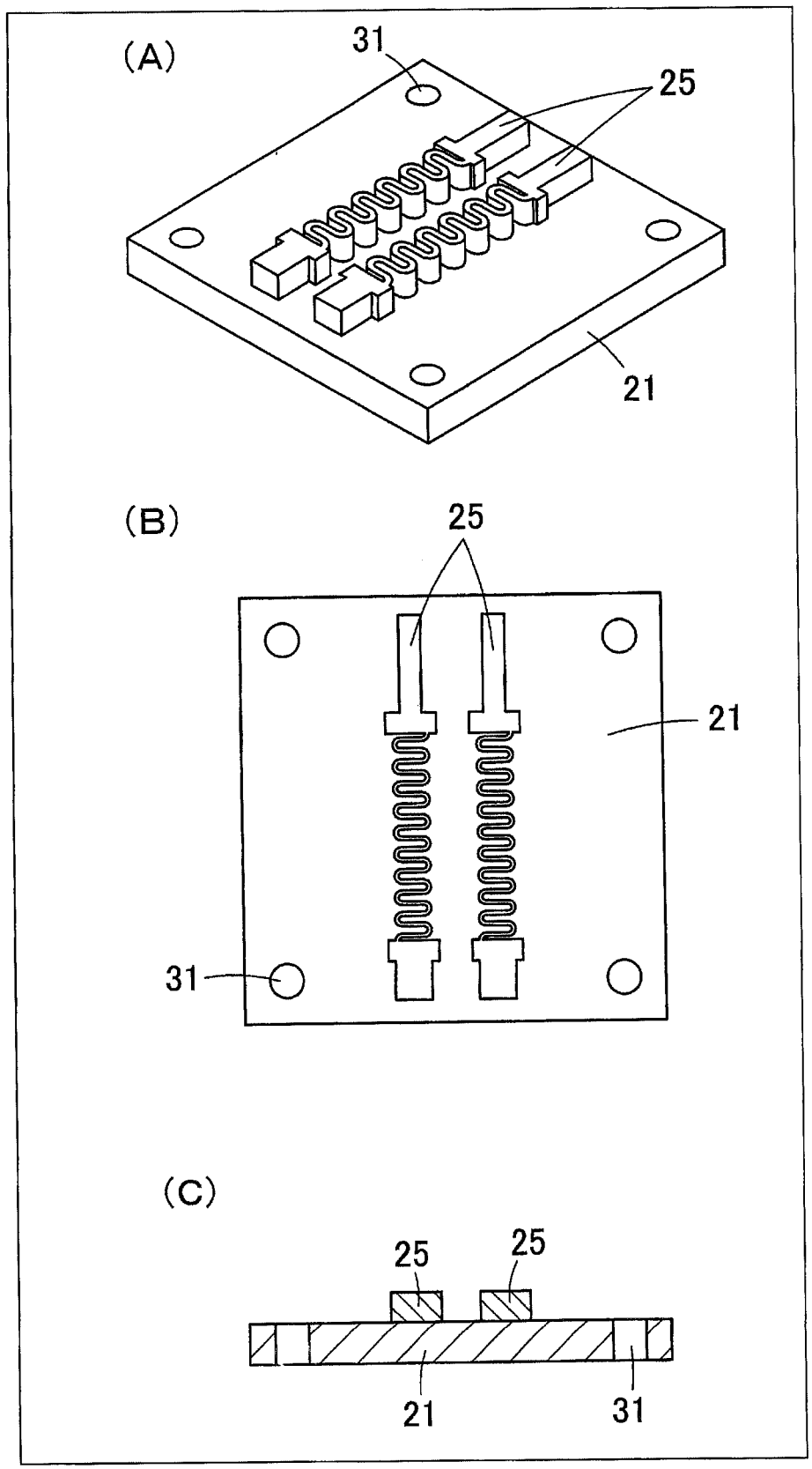

(A) through (C) of FIG. 17 are a perspective view, a plan view and a cross-sectional view, respectively, which illustrate a step of removing a mold form in accordance with Embodiment 2 of the present invention.

Figure 18:
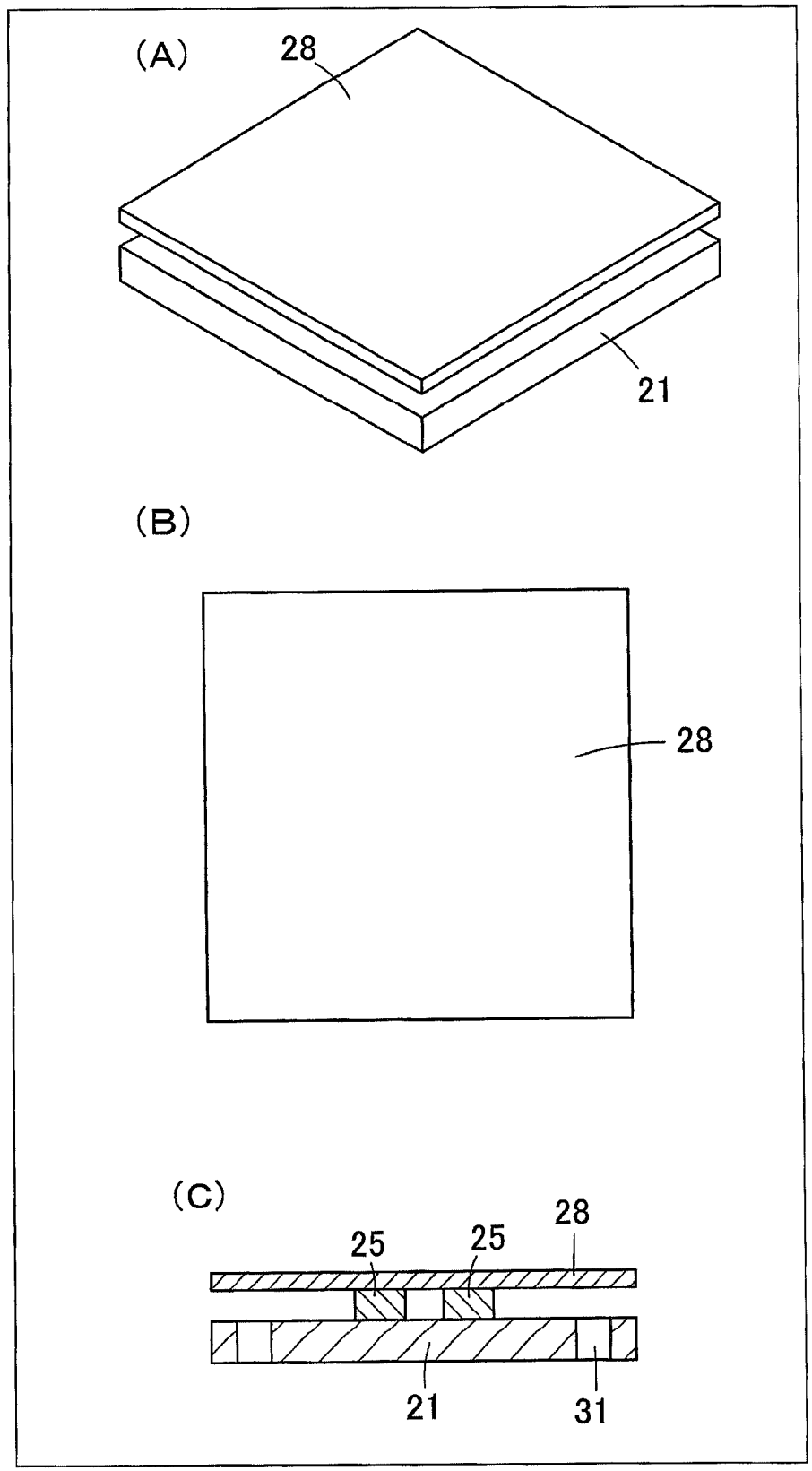

(A) through (C) of FIG. 18 are a perspective view, a plan view and a cross-sectional view, respectively, which illustrate a step of laminating an insulating film (dry film resist) in accordance with Embodiment 2 of the present invention.

Figure 19:
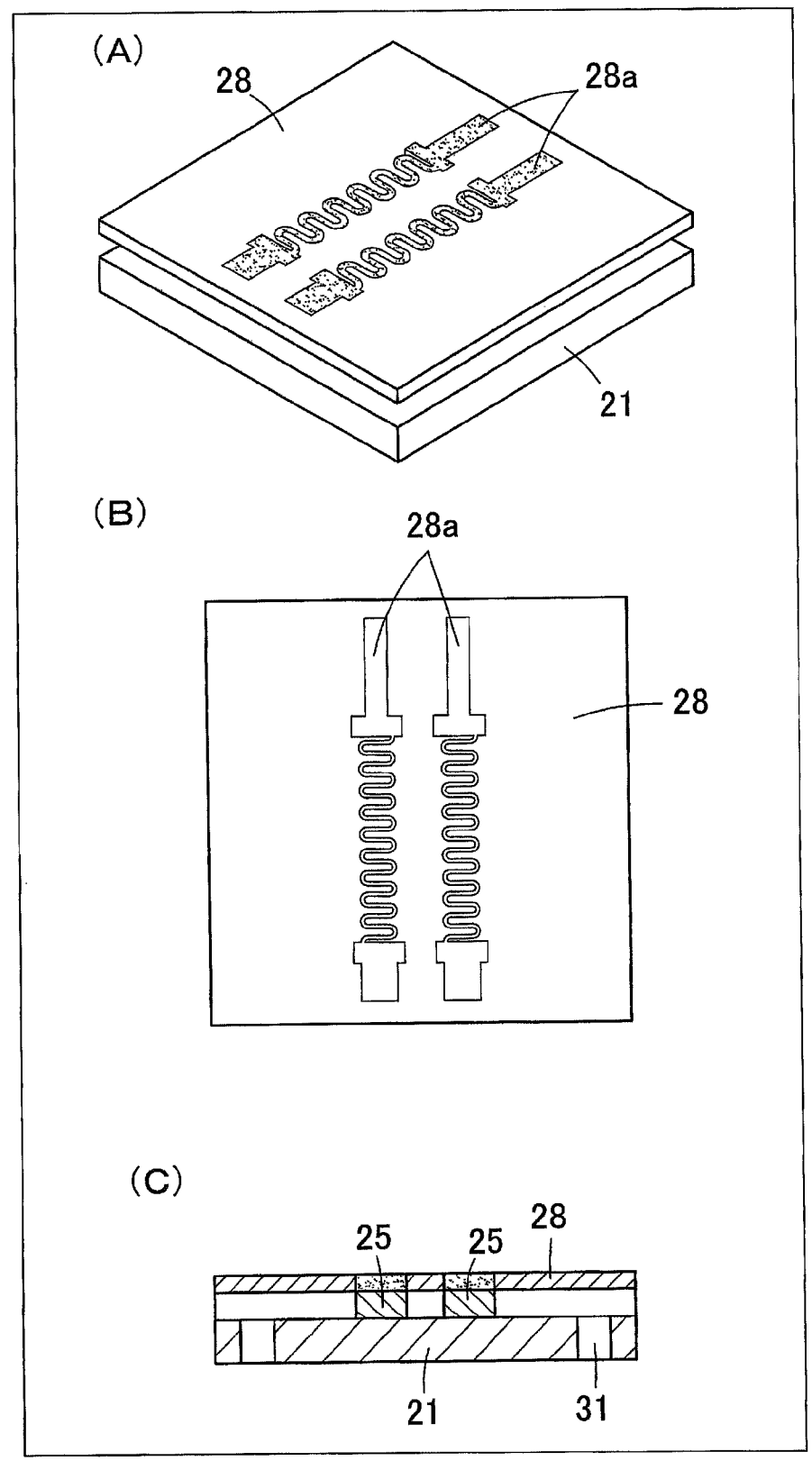

(A) through (C) of FIG. 19 are a perspective view, a plan view and a cross-sectional view, respectively, which illustrate a step of exposing the insulating film in accordance with Embodiment 2 of the present invention.

Figure 20:
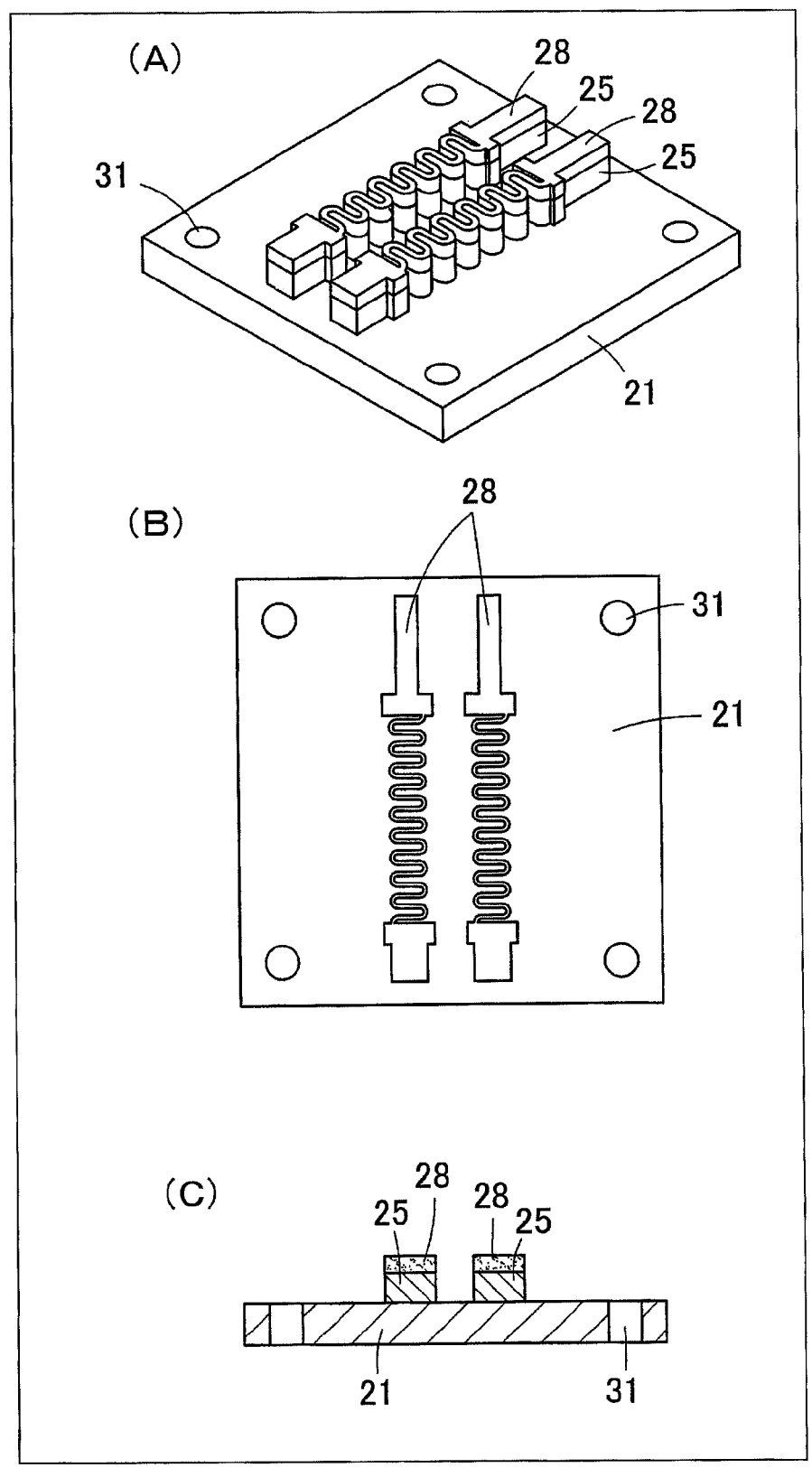

(A) through (C) of FIG. 20 are a perspective view, a plan view and a cross-sectional view, respectively, which illustrate a step of developing the insulating film in accordance with Embodiment 2 of the present invention.

Figure 21:
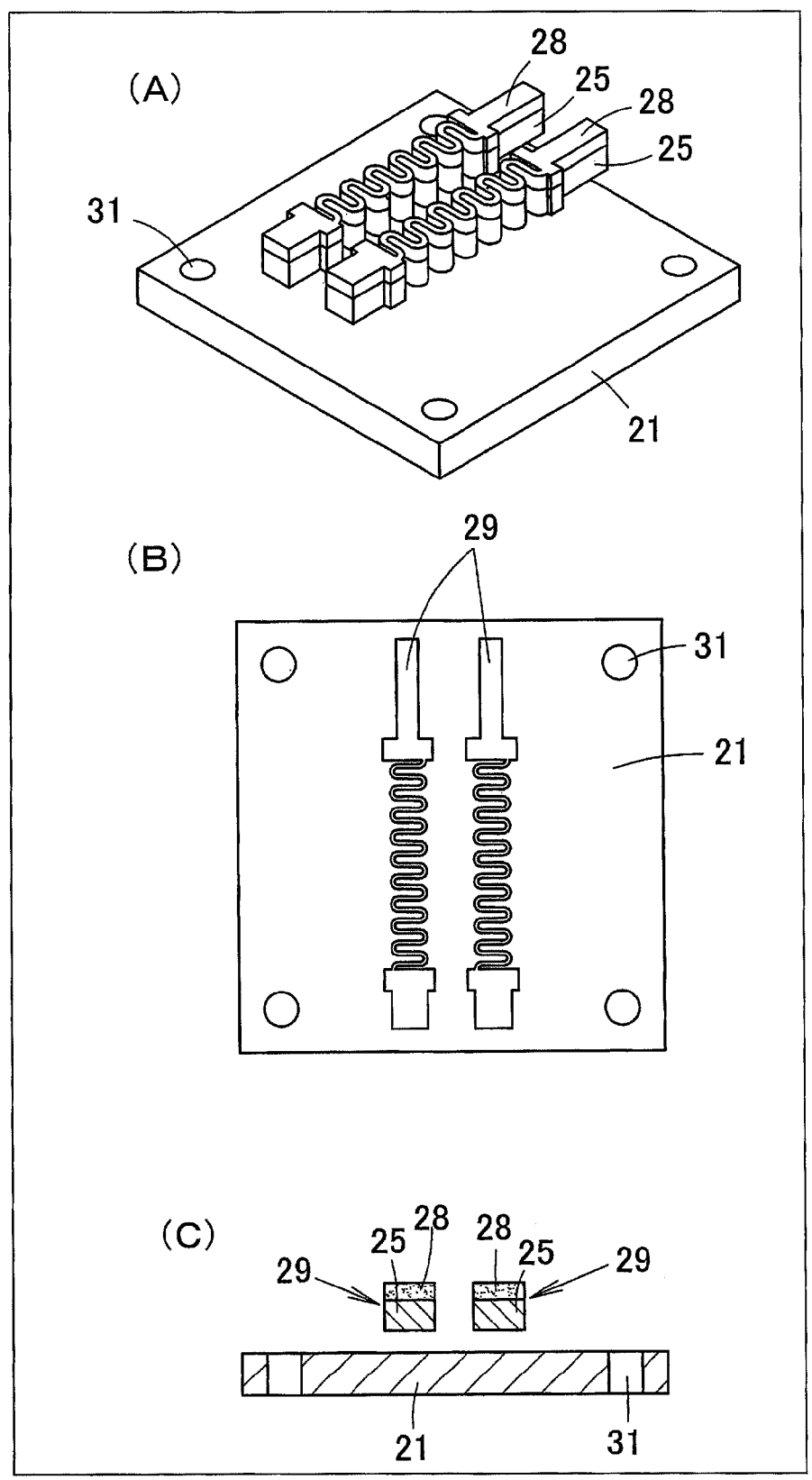

(A) through (C) of FIG. 21 are a perspective view, a plan view and a cross-sectional view, respectively, which illustrate a step of peeling electroformed components in accordance with Embodiment 2 of the present invention.

Figure 22:
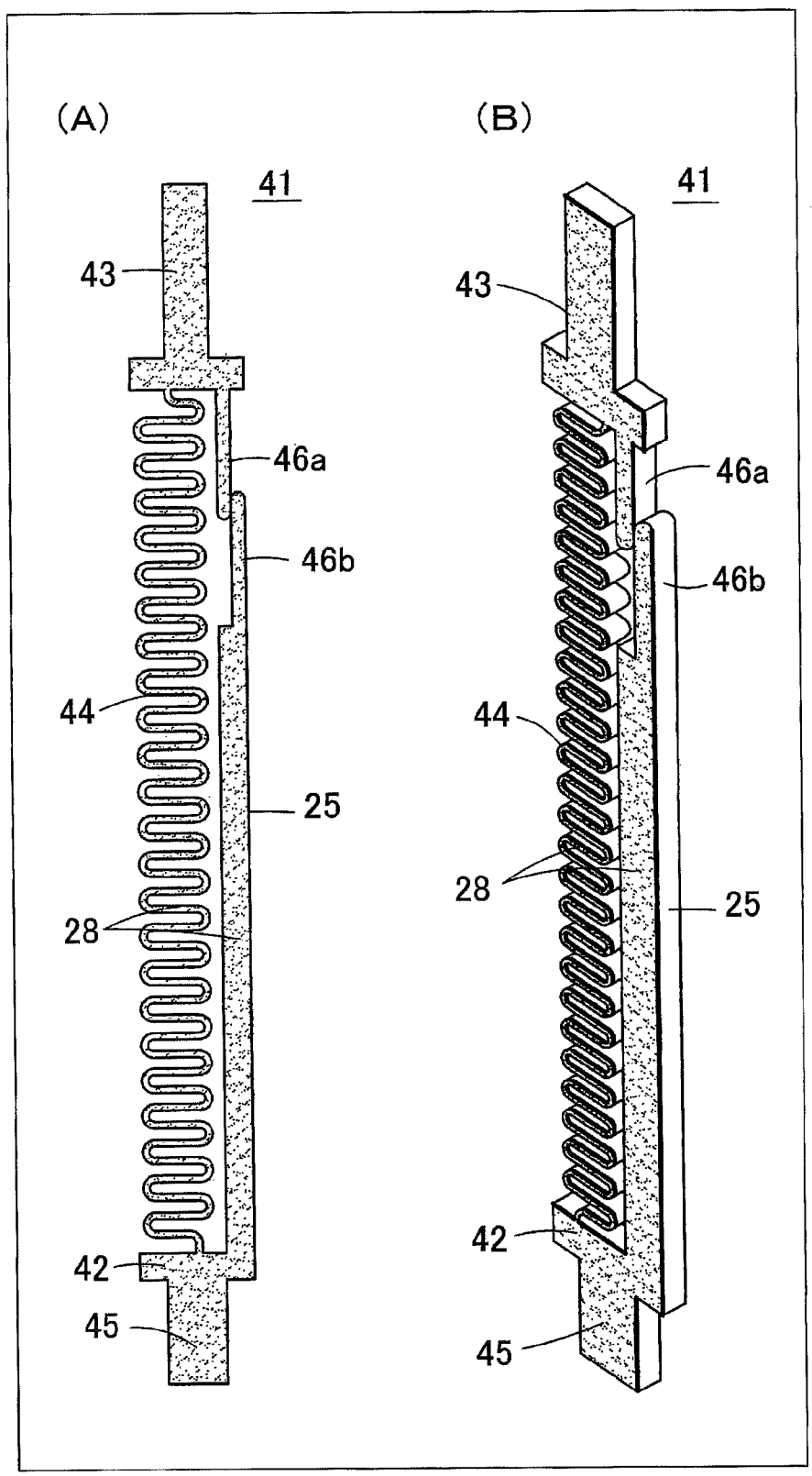

(A) and (B) of FIG. 22 are a front view and a perspective view, respectively, each of which illustrates a contact obtained by providing an insulating film all over a surface of a contact element (electroformed product).

Figure 23:
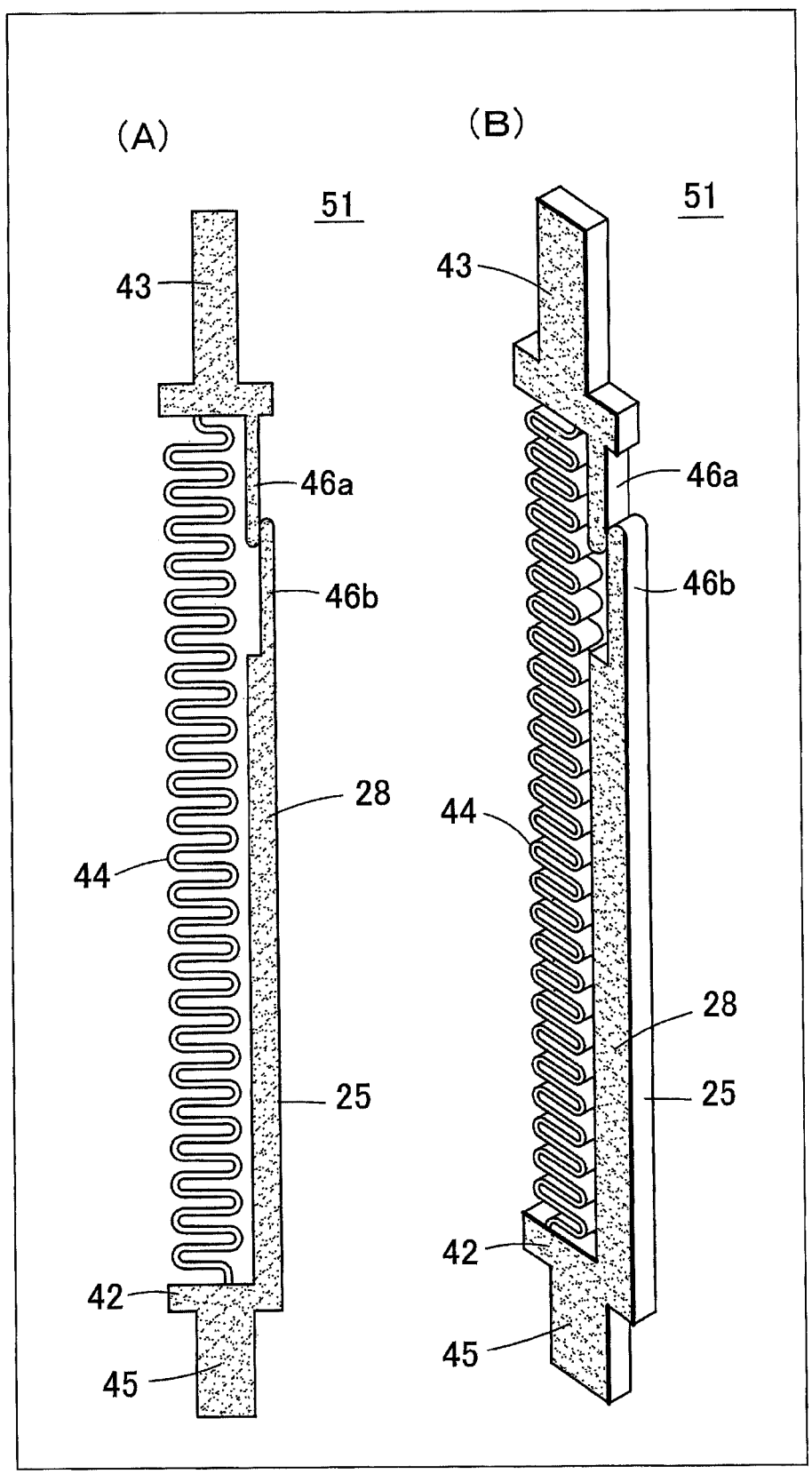

(A) and (B) of FIG. 23 are a front view and a perspective view, respectively, each of which illustrates a contact obtained by providing an insulating film on part of a contact element (electroformed product).

Figure 24:
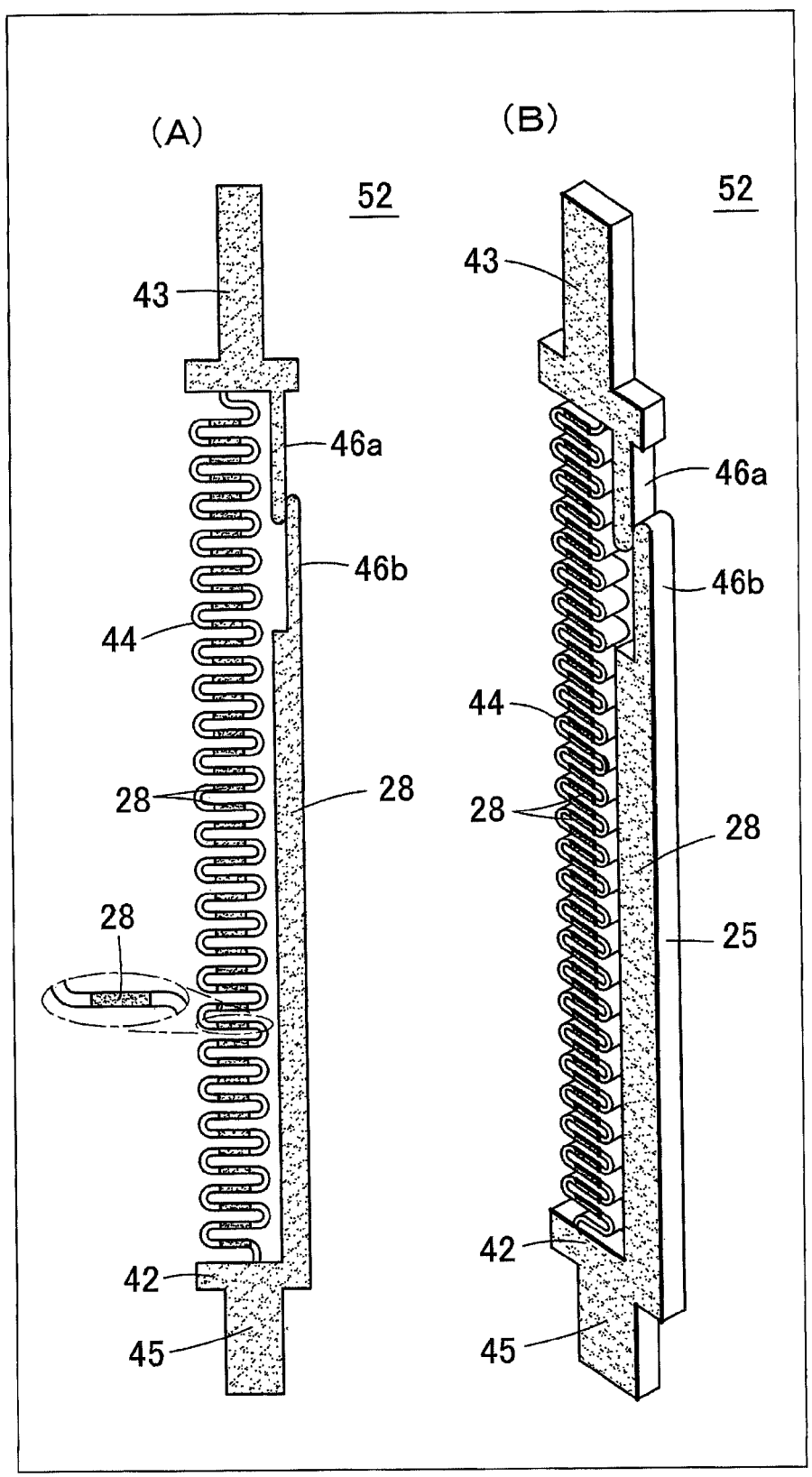

(A) and (B) of FIG. 24 are a front view and a perspective view, respectively, each of which illustrates another contact obtained by providing an insulating film on part of a contact element (electroformed product).

Figure 25:
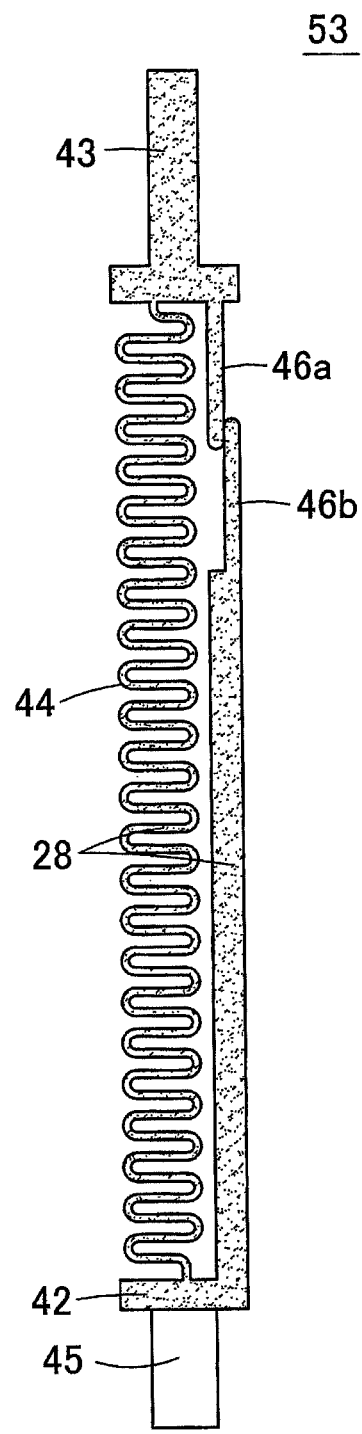

FIG. 25 is a front view illustrating yet another contact obtained by providing an insulating film on part of a contact element (electroformed product).

Figure 26:
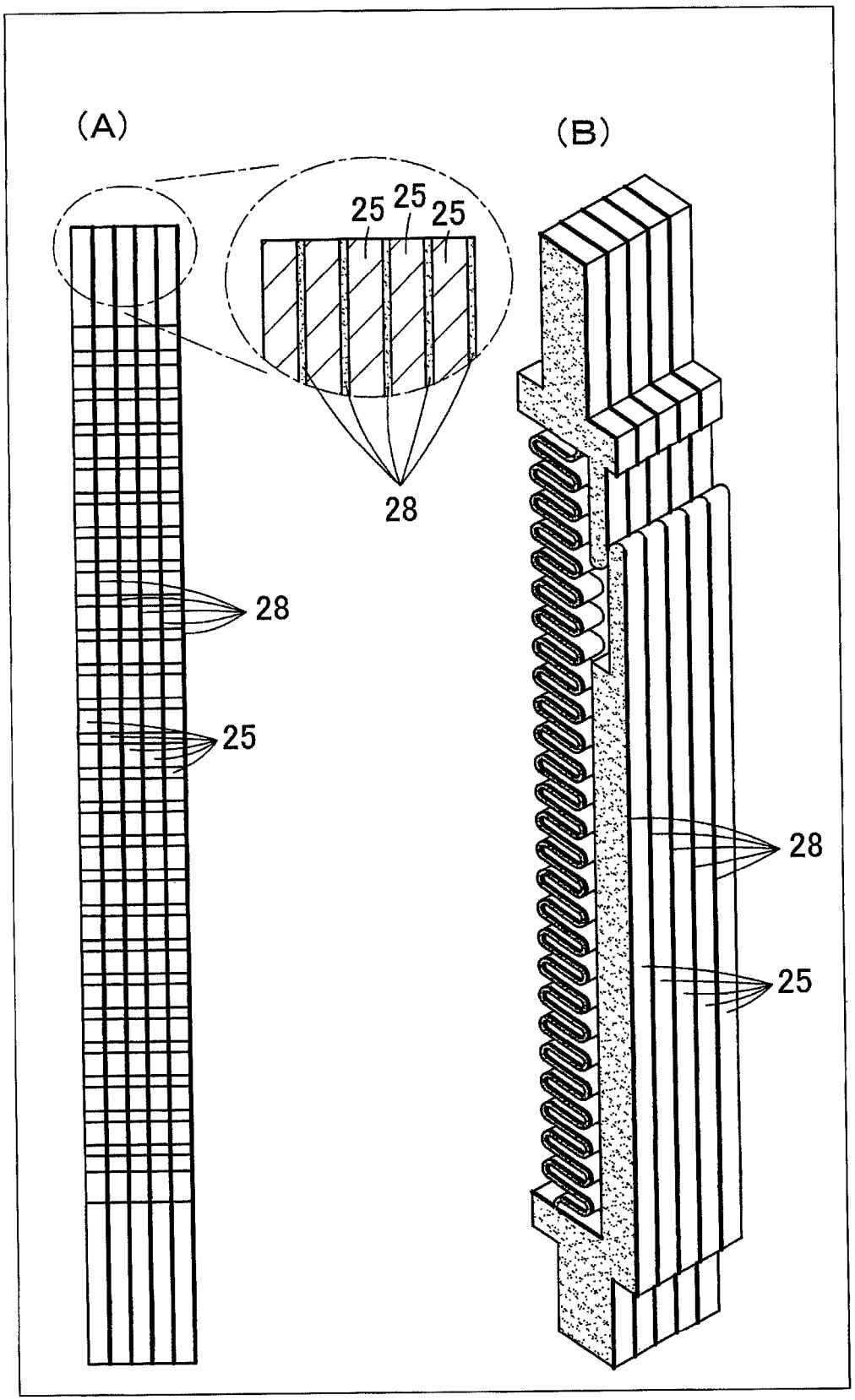

(A) and (B) of FIG. 26 are a side view and a perspective view, respectively, each of which illustrates contacts configured so that respective contact elements (electroformed products), on each of which an insulating film is provided, are arranged at narrow pitches.

DESCRIPTION OF EMBODIMENTS

The following description will discuss suitable embodiments of the present invention with reference to the drawings. Note, however, that the present invention is not limited to the description of the embodiments below, but can be altered in many ways by a person skilled in the art within the scope of the claims.

Embodiment 1

An electroformed component production method according to Embodiment 1 of the present invention will be described below with reference to FIGS. 2 to 11. In the embodiments below, contacts are taken as examples of an electroformed component. However, the present invention can be applied to electroformed components other than contacts.

According to an electroformed component production method of Embodiment 1, an electrically conductive base material 21 is first subjected to electrolytic degreasing. (A) of FIG. 2, (B) of FIG. 2 and (C) of FIG. 2 are a perspective view, a plan view and a cross-sectional view, respectively, which illustrate a step involved in the electrolytic degreasing ((A), (B) and (C) of each of FIGS. 3 to 11 are also a perspective view, a plan view and a cross-sectional view, respectively). The electrically conductive base material 21 is a stainless plate having flat surfaces. At least a top surface of the electrically conductive base material 21 has been processed so that a metal molded product, which has been electrodeposited on the top surface, can easily be peeled off. The electrically conductive base material 21 is degreased and cleaned in a step of electrolytic degreasing (electrolytic cleaning). The electrolytic degreasing is a process of degreasing the electrically conductive base material 21 by (i) causing the electrically conductive base material 21 to serve as a cathode or an anode in an alkaline solution or (ii) causing a polarity of the electrically conductive base material 21 to alternate.

Then, as illustrated in (A) of FIG. 3, (B) of FIG. 3 and (C) of FIG. 3, a negative dry film resist 22 comes into close contact with the top surface of the electrically conductive base material 21 so as to be laminated on the top surface of the electrically conductive base material 21. The dry film resist 22 is greater in thickness than an electroformed product (contact element 25). For example, the thickness of the dry film resist 22 is preferably several tens of micrometers or more. While the dry film resist 22 is preferable for facilitating the step, it is alternatively possible to use a liquid resist. For example, it is possible to apply a liquid resist to the top surface of the electrically conductive base material 21 and then carry out prebaking.

In a case where the dry film resist 22 has been laminated on the top surface of the electrically conductive base material 21, the dry film resist 22 is irradiated with an ultraviolet laser beam with the use of a direct writing exposure device, so that an area inside a predetermined region is scanned. (A) of FIG. 4, (B) of FIG. 4 and (C) of FIG. 4 illustrate the exposed region. In a case where a negative dry film resist 22 is used, an ultraviolet laser beam is scanned along regions 22a (which are obtained by providing a dot pattern on the dry film resist 22) for light exposure (see (A) of FIG. 4)). That is, in the case where the negative dry film resist is used, the ultraviolet laser beam is scanned along regions other than regions from which contact elements (25) and frame parts (26) are to be fabricated. In addition, regions, at which position determining marks are to be provided on the frame parts, are also irradiated with the ultraviolet laser beam. According to the direct writing exposure method, it is thus unnecessary to use a mask. This allows an exposing step to be simple, and therefore allows for a reduction in cost. Nevertheless, the present invention does not exclude light exposure with the use of a mask.

The above description discussed, with reference to FIG. 4, the case where a negative dry film resist is used. Note, however, that there is no problem in using a positive dry resist, a negative permanent dry resist, a negative liquid resist, a positive liquid resist, or a negative permanent liquid resist. In a case where a positive resist is to be used, regions other than the regions 22a are to be exposed to the light.

Then, the dry film resist 22, which has been exposed to the light, is developed and rinsed. This causes the regions of the negative dry film resist 22, other than the exposed regions 22a, to be removed by a developing solution. A remaining part of the dry film resist 22 becomes a mold form 22b. This, as illustrated in (A) of FIG. 5, (B) of FIG. 5 and (C) of FIG. 5, (i) causes cavities 23 for forming electroformed products to be fabricated in the mold form 22b and (ii) causes the electrically conductive base material 21 to be exposed at bottom surfaces of the cavities 23. In addition, (i) parts of the dry film resist 22, which parts correspond to frame regions at which the frame parts are to be formed, are peeled and (ii) protrusion parts 24, which are intended for forming the position determining marks in the frame regions, are formed.

Then, the contact elements 25 are formed by electroforming (electroforming method) with the use of the electrically conductive base material 21 and the mold form 22b which serve as a matrix. Although not illustrated, an electrodepositing step is carried out such that (i) the matrix is provided in an electrolytic cell and then (ii) an electric current flows through an electrolytic solution by applying, with the use of a direct power supply, a voltage between the electrically conductive base material 21 and a counter electrode. When the electric current has started flowing, metal ions in the electrolytic solution are electrodeposited on the surfaces of the electrically conductive base material 21. This causes metal to be precipitated. Meanwhile, the mold form blocks the electric current. This prevents the metal from being electrodeposited directly on the mold form even in a case where a voltage is applied between the matrix and the counter electrode. Therefore, as illustrated in (A) of FIG. 6, (B) of FIG. 6 and (C) of FIG. 6, a metal grows, in each of the cavities 23, in a voltage application direction d from the bottom surface, so that a contact element 25 is formed in each of the cavities 23. The contact element 25 thus grown includes (i) a spring part 44 which is elastically deformable in a direction f which is perpendicular to a voltage application direction and (ii) a terminal part 45 which is located so as to be able to be pressed, by elasticity of the spring part 44, against an external conductor (e.g. a terminal of an integrated circuit). In addition, as a result of precipitation of metal, frame parts 26 are formed outside the mold form 22b.

In so doing, a thickness of each of the metals (contact elements 25) thus electrodeposited is determined by an accumulated electric current flowing amount of the electric current (i.e. a time-based accumulated amount of the flowing electric current). This is because of the following reason: Since an amount of metal precipitated per unit of time is proportional to an electric current value, a volume of the metal in each of the cavities 23 is determined by the accumulated electric current flowing amount of the electric current. Therefore, the thickness of the metal can be known by the accumulated electric current flowing amount of the electric current.

When the contact elements 25 have been formed, the mold form 22b is peeled by etching or the like. When the mold form 22b has been peeled, as illustrated in (A) of FIG. 7, (B) of FIG. 7 and (C) of FIG. 7, the contact elements 25 remain attached to the top surface of the electrically conductive base material 21. In addition, in each of the frame parts 26 attached to the top surface of the electrically conductive base material 21, position determining marks 27 are formed after the protrusion parts 24 are peeled, which position determining marks 27 each have a form of a through-hole.

Note that the position determining marks can be post-like protrusion parts which are formed by electroforming on the surface of the electrically conductive base material.

After the contact elements 25 and the frame parts 26 have been thus formed, the electrically conductive base material 21 is then covered, from above, with an insulating film 28 which is photosensitive (see (A) of FIG. 8, (B) of FIG. 8 and (C) of FIG. 8). Then, the insulating film 28 comes into close contact with the top surfaces (main surfaces) of the contact elements 25 and of the frame parts 26. The insulating film 28 is a negative dry film resist.

Alternatively, there is no problem in using a positive resist or a negative permanent resist as an insulating film 28.

Then, the insulating film 28 is irradiated with an ultraviolet laser beam with the use of a direct writing exposure device, so that an area inside a predetermined region is scanned. (A) of FIG. 9, (B) of FIG. 9 and (C) of FIG. 9 illustrate the exposed region. In a case where a negative insulating film 28 is used, an ultraviolet laser beam is, for example, scanned along regions 28a (which are obtained by providing a dot pattern on the insulating film 28) for light exposure (see (A) of FIG. 9). That is, in the case where the negative insulating film 28 is used, the ultraviolet laser beam is scanned along predetermined regions located directly above the respective contact elements 25. In so doing, the direct writing exposure device (i) carries out image recognition of positions the respective position determining marks 27 which are visible through the insulating film 28 and then (ii) scans an ultraviolet laser beam with the position determining marks 27 serving as positional references. This allows an ultraviolet laser beam to be precisely scanned, for light exposure, along the predetermined regions located directly above the respective contact elements 25. In this case also, it is alternatively possible to use a mask for light exposure.

Then, the insulating film 28, which has been exposed to the light, is developed and rinsed. This causes regions of the negative insulating film 28, other than the exposed regions 28a, to be removed by a developing solution. This, as illustrated in (A) of FIG. 10, (B) of FIG. 10 and (C) of FIG. 10, causes insulating films 28 to be provided (i) all over the main surfaces (i.e. surfaces perpendicular to the voltage application direction during the electroforming) of the respective contact elements 25 or (ii) only on predetermined partial regions of the main surfaces.

Then, the contact elements 25 (i.e. contacts 29 (electroformed components)), which have the respective top surfaces on which the corresponding insulating films 28 are provided, are peeled from the electrically conductive base material 21 (see (A) of FIG. 11, (B) of FIG. 11 and (C) of FIG. 11).

With a method such as that described above, it is possible to (i) form, by a simple step on top surfaces (main surfaces) of extremely small contact elements 25, insulating films 28 having a uniform thickness and (ii) precisely form insulating films 28 all over surfaces of or on partial regions of contact elements 25 each having a complex shape.

Embodiment 2

Next, the following description will discuss, with reference to FIGS. 12 to 21, an electroformed component production method in accordance with Embodiment 2 of the present invention. The electroformed component production method of Embodiment 2 is different from that of Embodiment 1 in terms of how a position of an exposed region is determined in an exposing step. Therefore, part of Embodiment 2, which part is similar to Embodiment 1, will be briefly described.

According to the electroformed component production method of Embodiment 2, a plurality of position determining marks, that is, position determining holes 31, are first made at respective predetermined positions of an electrically conductive base material 21 (see (A) of FIG. 12, (B) of FIG. 12 and (C) of FIG. 12). (A) of FIG. 12, (B) of FIG. 12 and (C) of FIG. 12 are a perspective view, a plan view and a cross-sectional view, respectively, which illustrate a step of making the position determining holes 31 ((A), (B) and (C) of each of FIGS. 13 to 21 are also a perspective view, plan view and a cross-sectional view). The position determining holes 31 can be made by laser perforating or by drilling. Then, a surface of the electrically conductive base material 21, through which the position determining holes 31 are made, is cleaned and then subjected to electrolytic degreasing.

Note that in the example shown, position determining marks are the position determining holes 31 made through the electrically conductive base material 21. Alternatively, the position determining marks can be circular engraved marks, cross engraved marks or the like, or can be recess parts or the like.

Then, as illustrated in (A) of FIG. 13, (B) of FIG. 13 and (C) of FIG. 13, a negative dry film resist 22 comes into close contact with a top surface of the electrically conductive base material 21 so as to be laminated on the top surface of the electrically conductive base material 21. The dry film resist 22 is irradiated with an ultraviolet laser beam with the use of a direct writing exposure device, so that an area inside a predetermined region is scanned. (A) of FIG. 14, FIG. 14 and (C) of FIG. 14 illustrate the exposed region. In a case where a negative dry film resist 22 is used, an ultraviolet laser beam is scanned along regions 22a (which are obtained by providing a dot pattern on the dry film resist 22) for light exposure (see (A) of FIG. 4). That is, in the case where the negative dry film resist 22 is used, the ultraviolet laser beam is scanned along regions other than regions from which contact elements (25) and frame parts (26) are to be fabricated. In so doing, the direct writing exposure device (i) carries out image recognition of positions the respective position determining holes 31 which are visible through the dry film resist 22 and then (ii) scans an ultraviolet laser beam with the position determining holes 31 serving as positional references.

Then, the dry film resist 22, which has been exposed to the light, is developed and rinsed. This causes the regions of the negative dry film resist 22, other than the exposed regions 22a, to be removed by a developing solution. Therefore, as illustrated in (A) of FIG. 15, (B) of FIG. 15 and (C) of FIG. 15, cavities 23 for forming electroformed products are fabricated in the mold form 22b.

Then, as illustrated in (A) of FIG. 16, (B) of FIG. 16 and (C) of FIG. 16, metals are precipitated, by electroforming (electroforming method), in a matrix made up of the electrically conductive base material 21 and the mold form 22b. This causes contact elements 25 to be formed in the respective cavities 23.

When the contact elements 25 have been formed, the mold form 22b is peeled by etching or the like. This, as illustrated in (A) of FIG. 17, (B) of FIG. 17 and (C) of FIG. 17, causes the contact elements 25 to be provided on the top surface of the electrically conductive base material 21.

After the contact elements 25 have been formed, the electrically conductive base material 21 is then covered, from above, with an insulating film 28 (dry film resist) which is photosensitive (see (A) of FIG. 18, (B) of FIG. 18 and (C) of FIG. 18). Then, the insulating film 28 comes into close contact with the top surfaces of the contact elements 25. Then, the insulating film 28 is irradiated with an ultraviolet laser beam with the use of a direct writing exposure device, so that an area inside a predetermined region is scanned. (A) of FIG. 19, FIG. 19 and (C) of FIG. 19 illustrate the exposed region. In a case where a negative insulating film 28 is used, an ultraviolet laser beam is, for example, scanned along regions 28a (which are obtained by providing a dot pattern on the insulating film 28) for light exposure (see (A) of FIG. 9). That is, in the case where the negative insulating film 28 is used, the ultraviolet laser beam is scanned along predetermined regions located directly above the respective contact elements 25. In so doing, the direct writing exposure device (i) carries out image recognition of positions the respective position determining holes 31 which are visible through the insulating film 28 and then (ii) scans an ultraviolet laser beam with the position determining holes 31 serving as positional references.

The position determining holes 31 are thus used as the same references for controlling the exposed region both when the dry film resist 22 is subjected to direct writing light exposure and when the insulating film 28 is subjected to direct writing light exposure. This allows an ultraviolet laser beam to be precisely scanned, for light exposure, along the predetermined regions located directly above the respective contact elements 25. Therefore, it is possible to reduce an amount by which the respective positions of the contact elements 25 and of the insulating film 28 are shifted from each other.

Then, the insulating film 28, which has been exposed to the light, is developed and rinsed. This, as illustrated in (A) of FIG. 20, (B) of FIG. 20 and (C) of FIG. 20, causes regions of the negative insulating film 28, other than the exposed regions 28a, to be removed by a developing solution. This causes insulating films 28 to be provided (i) all over the main surfaces of the respective contact elements 25 or (ii) only on predetermined partial regions of the main surfaces.

Then, the contact elements 25 (i.e. contacts 29), which have the respective top surfaces on which the corresponding insulating films 28 are provided, are peeled from the electrically conductive base material 21 (see (A) of FIG. 11, (B) of FIG. 11 and (C) of FIG. 11).

With a method such as that described above also, it is possible to (i) form, by a simple step on top surfaces of extremely small contact elements 25, insulating films 28 having a uniform thickness and (ii) precisely form insulating films 28 all over surfaces of or on partial regions of contact elements 25 each having a complex shape.

Embodiment 3

(A) of FIG. 22 and (B) of FIG. 22 are a front view and a perspective view, respectively, each of which illustrates each of contacts 41 (electroformed component) produced by a method such as that described above. That is, (A) of FIG. 22 and (B) of FIG. 22 each illustrate a contact element 25 on which an insulating film 28 is provided. The contact element 25 is to be used as an integrated circuit inspection probe. A spring part 44 is provided, in a zigzag pattern, between a fixed part 42 and a movable part 43. At an end part of the fixed part 42, a terminal part 45 is provided. The spring part 44, which connects the fixed part 42 and the movable part 43, is thin. This causes an electrical resistance between the fixed part 42 and the movable part 43 to be large. Therefore, the resistance between the fixed part 42 and the movable part 43 is made small by causing a movable contact segment 46a, which is provided on the movable part 43, and a movable contact segment 46b, which is provided on the fixed part 42, to be slidably in contact with each other. In addition, the insulating film 28 is provided all over a main surface on one side of the contact element 25 (i.e. surface perpendicular to a voltage application direction during electroforming).

The contacts 41 are to be used, as described later, while being arranged at narrow pitches while maintaining electrical insulation of the contact elements 25 from each other. The contacts 41 are contained in a casing (not illustrated). The fixed parts 42 are fixed to the casing. The terminal parts 45 protrude from the casing. In such a state, the terminal parts come in contact with corresponding terminals of an integrated circuit, and the movable parts 43 are pressed down. This causes the terminal parts 45 to be pressed, by elasticity of the spring parts 44, against the corresponding terminals of the integrated circuit. Then, for example, electrical conduction failure or the like of each of the terminals of the integrated circuit is inspected.

Embodiment 4

(A) of FIG. 23 and (B) of FIG. 23 show another example of each of contacts produced by a method such as that described above. According to a contact 51, an insulating film 28 is provided all over, except for a region corresponding to a spring part 44, a main surface on one side of a contact element 25. The spring part 44 has an elastically deformable portion. Therefore, there is a risk that if the insulating film 28 is provided on the elastically deformable portion of the spring part 44, then the insulating film 28 may be peeled from the contact element 25 or may have a crack developed therein. Therefore, it is possible not to provide the insulating film 28 on the elastically deformable portion of the spring part 44.

(A) of FIG. 24 and (B) of FIG. 24 show a modification of the contact 51 illustrated in FIG. 23. According to the contact 52 of the modification, an insulating film 28 is provided on an entire portion of a spring part 44 except for portions where deforming amounts are so large that stress can easily concentrated on the portions. The insulating film 28 is provided on straight portions of the spring part 44, which straight portions each have a relatively small deforming amount.

Embodiment 5

(A) of FIG. 25 and (B) of FIG. 25 illustrate another example of each of contacts produced by a method such as that described above. According to a contact 53, an insulating film 28 is provided all over, except for a region corresponding to a terminal part 45, a main surface on one side of a contact element 25. According to the contact 53, the insulating film 28 is provided all over the main surface except for the region corresponding to the terminal part 45, and then the terminal part 45 is plated with Au, solder, or the like.

Embodiment 6

The contacts illustrated in each of FIGS. 22 to 25 are to be used so as to be stacked with each other while sandwiching an insulating film 28 between adjacent contact elements 25 (see (A) of FIG. 26 and (B) of FIG. 26). This process of stacking the contacts together can be made easy by being carried out during the step of producing the contacts. Therefore, it is possible to precisely arrange, at narrow pitches, thin and extremely small contact elements while maintaining electrical insulation of the contact elements from each other.

Note that in any of the above embodiments, an insulating film was provided only on a main surface on one side of a contact element. Alternatively, an insulating film can be provided on both main surfaces of a contact element (not illustrated).

SUMMARY

As described above, an electroformed component production method of the present invention includes: an electrodepositing step of fabricating an electroformed product by electrodepositing a metal on an exposed surface which is at least part of an electrically conductive base material and which is exposed within an opening of an insulating mold form; a mold form removing step of removing the insulating mold form from a surface of the electrically conductive base material; an insulating film forming step of covering a surface of the electroformed product with an insulating film; and an insulating film removing step of removing part of the insulating film while causing a remaining part of the insulating film to remain on at least part of the surface of the electroformed product.

With the electroformed component production method of the present invention, it is possible to provide an insulating film on a surface of an electroformed product during a step of producing the electroformed product. This allows a thin insulating film to be provided on at least part of the surface of the electroformed product. Therefore, in a case where (i) the electroformed product includes a plurality of electroformed products, (ii) the insulating film includes a plurality of insulating films, and (iii) the plurality of electroformed products and the plurality of insulating films are alternately stacked, it is possible to arrange the plurality of electroformed products at narrow pitches while maintaining electrical insulation of the electroformed products from each other. In addition, the insulating film is thus provided on the surface of the electroformed product during the step of producing the electroformed product. Therefore, in a case where the electroformed product includes a plurality of electroformed products, the plurality of electroformed products can be stacked together during a step of producing the electroformed products. This allows the electroformed products to be precisely stacked together with an excellent production yield.

In the insulating film forming step, the insulating film covering the surface of the electroformed product can be a dry film resist or a liquid resist which has been applied to the surface of the electroformed product. In a case where the insulating film is a dry film resist, it is possible to facilitate the film forming step.

In order to fabricate the insulating mold form, it is only necessary to cause the part of the electrically conductive base material to be exposed in the opening by making the opening through part of an insulating mold form material which is provided on the surface of the electrically conductive base material (mold form fabricating step). After the insulating film removing step, it is only necessary to peel, from the electrically conductive base material, the electroformed product having the surface on which the remaining part of the insulating film is provided.

According to an aspect of the electroformed component production method in accordance with the present invention, the insulating film is a photosensitive film; and the insulating film removing step includes (i) an exposing step of irradiating, after the insulating film forming step, the insulating film with light while the electroformed product serves as a positional reference, so that a partial region, which corresponds to the at least part of the surface of the electroformed product, is made insoluble in a developing solution and (ii) a developing step of subjecting the insulating film to a development process, so as to remove a region of the insulating film, the region not having been made insoluble in the developing solution. With the aspect, it is possible to precisely pattern an insulating film by use of, for example, a negative resist and a photolithography technique.

According to another aspect of the electroformed component production method in accordance with the present invention, the insulating film is a photosensitive film; and the insulating film removing step includes (i) an exposing step of irradiating, after the insulating film forming step, the insulating film with light while the electroformed product serves as a positional reference, so that a region of the insulating film, which region is other than a partial region corresponding to the at least part of the surface of the electroformed product, is made soluble and (ii) a developing step of subjecting the insulating film to a development process, so as to remove the region of the insulating film. With the aspect, it is possible to precisely pattern an insulating film by use of, for example, a positive resist and a photolithography technique.

According to yet another aspect of the electroformed component production method in accordance with the present invention, the electroformed component production method further includes: a mold form fabricating step of (i) fabricating the insulating mold form by making the opening through an insulating mold form material which is provided on the surface of the electrically conductive base material and (ii) forming, with use of the insulating mold form material, a recess part or a protrusion part any of which is intended for fabricating a position determining mark, in the electrodepositing step, (i) the electroformed product being fabricated in the opening and (ii) the recess part or the protrusion part fabricating the position determining mark having a protruding form or a recessed form, respectively, and in the exposing step, light irradiation being carried out while the position determining mark serves as a positional reference. With the aspect, it is possible pattern the insulating film while the position determining mark, which is fabricated during the fabrication of the electroformed product, serves as a reference. This allows the insulating film to be precisely positioned with respect to the electroformed product.

According to a further aspect of the electroformed component production method in accordance with the present invention, the electroformed component production method further includes: a mold form material providing step of providing an insulating mold form material on a surface of the electrically conductive base material, which surface has a position determining mark; and a mold form fabricating step of fabricating the insulating mold form by making the opening through part of the insulating mold form material while the position determining mark serves as a positional reference, in the exposing step, light irradiation being carried out while the position determining mark serves as a positional reference. With the aspect, it is possible to (i) fabricate the electroformed product while a position determining hole, which is provided on the electrically conductive base material, serves as a reference and (ii) pattern the insulating film while the position determining hole serves as a reference. This allows the insulating film to be precisely positioned with respect to the electroformed product.

The electroformed component production method of the present invention can be used for, for example, a method of producing a contact which is an electroformed product.

A contact of the present invention includes: an electroformed product including (i) a spring part which is elastically deformable in a direction perpendicular to a voltage application direction in which a voltage is applied during formation of the contact by electroforming and (ii) a terminal part provided so as to be able to be pressed, by the spring part, against an external conductor; and an insulating film provided on at least part of a main surface of the electroformed product, which main surface is perpendicular to the voltage application direction.

The contact of the present invention is configured so that the insulating film is provided on at least part of a main surface of the electroformed product. Therefore, in a case where (i) the electroformed product includes a plurality of electroformed products, (ii) the insulating film includes a plurality of insulating films, and (iii) the plurality of electroformed products and the plurality of insulating films are alternately stacked, it is possible to arrange the plurality of electroformed products at narrow pitches while maintaining electrical insulation of the plurality of electroformed products from each other. Note that the main surface herein refers to a surface of the electroformed product, which surface is perpendicular to a voltage application direction in which a voltage is applied during electroforming. Note also that the insulating film herein does not include an oxide film or the like of the electroformed product.

According to an aspect of the contact in accordance with the present invention, the insulating film can be provided on at least part of a main surface on one side of the electroformed product or can be provided on at least part of each of both main surfaces of the electroformed product.

According to another aspect of the contact in accordance with the present invention, the insulating film can be provided on only part of the electroformed product. For example, a region, which protrudes from the insulating film on the electroformed product, can be plated with, for example, Au.

The insulating film can be provided on a region other than the spring part of the electroformed product. Alternatively, the insulating film can be provided on a region other than a part on which stress is concentrated when the electroformed product is elastically deformed. By providing the insulating film only on the spring part or on the region, it is possible to prevent the insulating film from being peeled by elastically deformation of the electroformed product or from breaking.

An electroformed component of the present invention includes: an insulating film provided on at least part of a main surface of the electroformed component, the main surface being perpendicular to a voltage application direction in which a voltage is applied during formation of the electroformed component by electroforming. The electroformed component of the present invention is configured so that the insulating film is thus provided on at least part of a main surface of the electroformed component. Therefore, in a case where (i) the electroformed product includes a plurality of electroformed products, (ii) the insulating film includes a plurality of insulating films, and (iii) the plurality of electroformed products and the plurality of insulating films are alternately stacked, it is possible to arrange the plurality of electroformed products at narrow pitches while maintaining electrical insulation of the plurality of electroformed products from each other. Note that the main surface herein refers to a surface perpendicular to a voltage application direction in which a voltage is applied during electroforming. Note also that the insulating film herein does not include an oxide film or the like of the electroformed product.

Note that according to the present invention, the technical means to solve the problem encompass a proper combination of the constituent elements disclosed above. The present invention can be altered in many ways by the proper combination of the constituent elements.

REFERENCE SIGNS LIST

21 Electrically conductive base material
22 Dry film resist
22a Exposed region
22b Mold form
23 Cavity
24 Protrusion part
25 Contact element (electroformed product)
26 Frame part
27 Position determining mark
28 Insulating film
28a Exposed region
29, 41, 51, 52, 53 Contact (electroformed component)
31 Position determining hole
44 Spring part
46a, 46b Movable contact segment

The invention claimed is:

1. A method of producing an electroformed component, comprising:
 a mold form fabricating step of (i) fabricating an insulating mold form by making an opening through an insulating mold form material which is provided on a surface of an electrically conductive base material so that part of the electrically conductive base material is exposed within the opening and (ii) forming, with use of the insulating mold form material, a recess part or a protrusion part, any of which is intended for fabricating a position determining mark;
 an electrodepositing step, of (i) fabricating an electroformed product by electrodepositing a metal on an exposed surface of the electrically conductive base material, the exposed surface being exposed within the opening and (ii) fabricating, by use of the recess part or the protrusion part, the position determining mark having a protruding form or a recessed form, respectively;
 a mold form removing step of removing the insulating mold form from the surface of the electrically conductive base material;
 an insulating film forming step of covering a surface of the electroformed product with an insulating film which is a photosensitive film;
 after the insulating film forming step, an exposing step of irradiating part of the insulating film with light while the position determining mark serves as a positional reference;
 an insulating film removing step of subjecting the insulating film to a development process so as to remove part of the insulating film while causing a remaining part of the insulating film to remain on at least part of the surface of the electroformed product; and
 after the insulating film removing step, a peeling step of peeling, from the electrically conductive base material, the electroformed product having the surface on which the remaining part of the insulating film is provided.

2. The method as set forth in claim 1, wherein:
 in the exposing step, light irradiation causes a partial region, which corresponds to the at least part of the surface of the electroformed product, to be insoluble in a developing solution; and
 in the insulating film removing step, a region of the insulating film, the region not having been made insoluble in the developing solution, is removed by the development process.

3. The method as set forth in claim 1, wherein:
 in the exposing step, light irradiation causes a region of the insulating film, which region is other than a partial region corresponding to the at least part of the surface of the electroformed product, to be soluble; and
 in the insulating film removing step, the region of the insulating film is removed by the development process.

4. The method as set forth in claim 1, wherein
 in the insulating film forming step, the insulating film covering the surface of the electroformed product is a dry film resist.

5. The method as set forth in claim 1, wherein
 in the insulating film forming step, the insulating film covering the surface of the electroformed product is a liquid resist which has been applied to the surface of the electroformed product.

6. A method of producing an electroformed component, comprising:
 a mold form material providing step of providing an insulating mold form material on a surface of an electrically conductive base material, which surface has a position determining mark;
 a mold form fabricating step of fabricating an insulating mold form by making an opening through part of the insulating mold form material while the position determining mark serves as a positional reference so that part of the electrically conductive base material is exposed within the opening;

an electrodepositing step of fabricating an electroformed product by electrodepositing a metal on an exposed surface of the electrically conductive base material, the exposed surface being exposed within the opening;

a mold form removing step of removing the insulating mold form from the surface of the electrically conductive base material;

an insulating film forming step of covering a surface of the electroformed product with an insulating film which is a photosensitive resin;

after the insulating film forming step, an exposing step of (i) causing a direct writing exposure device to carry out image recognition of a position of the position determining mark which is visible through the insulating film and (ii) irradiating part of the insulating film with light while the position determining mark serves as the positional reference;

an insulating film removing step of subjecting the insulating film to a development process so as to remove part of the insulating film while causing a remaining part of the insulating film to remain on at least part of the surface of the electroformed product; and after the insulating film removing step, a peeling step of peeling, from the electrically conductive base material the electroformed product having the surface on which the remaining part of the insulating film is provided.

7. The method as set forth in claim 6, wherein
in the mold form fabricating step, a direct writing exposure device carries out image recognition of the position of the position determining mark which is visible through the insulating mold form material.

8. The method as set forth in claim 6, wherein:
in the exposing step, light irradiation causes a partial region, which corresponds to the at least part of the surface of the electroformed product, to be insoluble in a developing solution; and
in the insulating film removing step, a region of the insulating film, the region not having been made insoluble in the developing solution, is removed by the development process.

9. The method as set forth in claim 6, wherein:
in the exposing step, light irradiation causes a region of the insulating film, which region is other than a partial region corresponding to the at least part of the surface of the electroformed product, to be soluble; and
in the insulating film removing step, the region of the insulating film is removed by the development process.

10. A method of producing an electroformed component, comprising:
a mold form fabricating step of (i) fabricating an insulating mold form by making an opening through an insulating mold form material which is provided on a surface of an electrically conductive base material so that part of the electrically conductive base material is exposed within the opening and (ii) forming, with use of the insulating mold form material, a recess part or a protrusion part, any of which is intended for fabricating a position determining mark;

an electrodepositing step of (i) fabricating an electroformed product by electrodepositing a metal on an exposed surface of the electrically conductive base material, the exposed surface being exposed within the opening and (ii) fabricating, by use of the recess part or the protrusion part, the position determining mark having a protruding form or a recessed form, respectively;

a mold form removing step of removing the insulating mold form from the surface of the electrically conductive base material;

an insulating film forming step of covering a surface of the electroformed product with an insulating film which is a photosensitive film;

after the insulating film forming step, an exposing step of irradiating part of the insulating film with light while the position determining mark serves as a positional reference;

an insulating film removing step of subjecting the insulating film to a development process so as to remove part of the insulating film while causing a remaining part of the insulating film to remain on at least part of the surface of the electroformed product; and after the insulating film removing step, a peeling step of peeling, from the electrically conductive base material, the electroformed product having the surface on which the remaining part of the insulating film is provided, wherein the electroformed product is a contact.

11. A method of producing an electroformed component, comprising:
a mold form material providing step of providing an insulating mold form material on a surface of an electrically conductive base material, which surface has a position determining mark;

a mold form fabricating step of fabricating an insulating mold form by making an opening through part of the insulating mold form material while the position determining mark serves as a positional reference so that part of the electrically conductive base material is exposed within the opening;

an electrodepositing step of fabricating an electroformed product by electrodepositing a metal on an exposed surface of the electrically conductive base material, the exposed surface being exposed within the opening;

a mold form removing step of removing the insulating mold form from the surface of the electrically conductive base material;

an insulating film forming step of covering a surface of the electroformed product with an insulating film which is a photosensitive resin;

after the insulating film forming step, an exposing step of (i) causing a direct writing exposure device to carry out image recognition of a position of the position determining mark which is visible through the insulating film and (ii) irradiating part of the insulating film with light while the position determining mark serves as a positional reference; and an insulating film removing step of subjecting the insulating film to a development process so as to remove part of the insulating film while causing a remaining part of the insulating film to remain on at least part of the surface of the electroformed product; and after the insulating film removing step, a peeling step of peeling, from the electrically conductive base material, the electroformed product having the surface on which the remaining part of the insulating film is provided, wherein the electroformed product is a contact.

* * * * *